(12) United States Patent
Murade

(10) Patent No.: US 6,627,485 B2
(45) Date of Patent: Sep. 30, 2003

(54) ELECTRO-OPTICAL DEVICE, METHOD FOR FABRICATING THE SAME, AND ELECTRONIC APPARATUS

(75) Inventor: Masao Murade, Suwa (JP)

(73) Assignee: Seiko Espon Corporation, Tokyo (JP)

( * ) Notice: Subject to any disclaimer, the term of this patent is extended or adjusted under 35 U.S.C. 154(b) by 0 days.

(21) Appl. No.: 10/235,933

(22) Filed: Sep. 6, 2002

(65) Prior Publication Data

US 2003/0062542 A1 Apr. 3, 2003

Related U.S. Application Data

(62) Division of application No. 09/816,209, filed on Mar. 26, 2001.

(30) Foreign Application Priority Data

Mar. 27, 2000 (JP) ........................................ 2000-087151
Jan. 23, 2001 (JP) ........................................ 2001-014350

(51) Int. Cl.[7] .............................................. H01L 21/00
(52) U.S. Cl. ...................... 438/155; 438/142; 438/149
(58) Field of Search ................... 438/142–308

(56) References Cited

U.S. PATENT DOCUMENTS

| 5,641,974 | A | * | 6/1997 | den Boer et al. ............. 257/59 |
| 5,742,365 | A | | 4/1998 | Seo |
| 5,849,601 | A | | 12/1998 | Yamazaki |
| 5,903,014 | A | | 5/1999 | Ino et al. |
| 5,963,278 | A | | 10/1999 | Yamazaki et al. |
| 6,022,753 | A | * | 2/2000 | Park et al. ..................... 438/30 |
| 6,207,480 | B1 | * | 3/2001 | Cha et al. ................... 438/155 |
| 6,274,887 | B1 | | 8/2001 | Yamazaki et al. |
| 6,303,963 | B1 | | 10/2001 | Ohtani et al. |

FOREIGN PATENT DOCUMENTS

| KR | 1999-72286 | 9/1999 |
| WO | WO99/23530 | 5/1999 |

* cited by examiner

Primary Examiner—David Nelms
Assistant Examiner—Andy Huynh
(74) Attorney, Agent, or Firm—Oliff & Berridge, PLC.

(57) ABSTRACT

In a substrate, a portion for forming wiring extending to a connection terminal is provided with a recess. The connection terminal and the wiring are covered by an interlayer insulating film, and an opening is provided in a portion corresponding to the connection terminal. Thereby, a difference in level between the connection terminal and the wiring extending thereto is reduced.

9 Claims, 14 Drawing Sheets

ELECTRO-OPTICAL DEVICE, METHOD FOR FABRICATING THE SAME, AND ELECTRONIC APPARATUS

This is a Division of application Ser. No. 09/816,209 filed Mar. 26, 2001. The entire disclosure of the prior application(s) is hereby incorporated by reference herein in its entirety.

BACKGROUND OF THE INVENTION

1. Field of Invention

The present invention relates to an electro-optical device in which a difference in surface level in the connection terminal-formed region is minimized, to a method for fabricating the same, and to an electronic apparatus using the electro-optical device as a display unit.

2. Description of Related Art

In general, in an electro-optical device, for example, in a liquid crystal device which performs a predetermined display using a liquid crystal as an electro-optical material, the liquid crystal is sandwiched between a pair of substrates. As one of such a liquid crystal device, for example, an active matrix liquid crystal device, in which a pixel electrode is driven by a three terminal switching element, has the structure described below. That is, one substrate of a pair of substrates constituting such a liquid crystal device is provided with a plurality of scanning lines and a plurality of data lines intersecting with each other. At each intersection thereof, a three-terminal switching element, such as a TFT (Thin Film Transistor), and a pixel electrode are formed as a set, and peripheral circuits for driving the individual scanning lines and data lines are provided in the periphery of the region (display region) in which these pixel electrodes are formed. The other substrate is provided with a transparent counter electrode facing the pixel electrodes. Additionally, an alignment layer, which has been subjected to rubbing treatment so that the long axis directions of the liquid crystal molecules are continuously twisted, for example, by approximately 90 degrees, between the two substrates, is provided on the inner surface of each substrate. A polarizer corresponding to the alignment direction is provided on the outer surface of each substrate.

Herein, image signals are usually supplied via image signal lines, and are sampled to the individual data lines by sampling switches with appropriate timing. The switching element provided at the intersection between each scanning line and each data line is turned on when a scanning signal applied to the corresponding scanning line is at an active level, so that the image signal sampled to the corresponding data line is supplied to the pixel electrode. The counter electrode provided on the counter substrate is maintained at a predetermined electric potential.

In such a structure, when the scanning signal supplied to each scanning line and the sampling signal for controlling the sampling switch are supplied with appropriate timing by the peripheral circuits, an effective voltage corresponding to the image signal is applied, pixel by pixel, to a liquid crystal capacitor composed of the pixel electrode, the counter electrode, and the liquid crystal sandwiched between both electrodes.

At this stage, light passing between the pixel electrode and the counter electrode is optically rotated by approximately 90 degrees along the twist of the liquid crystal molecules if the voltage difference between both electrodes is zero. As the voltage difference is increased, since the liquid crystal molecules are inclined in the electric field direction, the optical activity thereof disappears. Therefore, for example, in a transmissive electro-optical device, when polarizers in which the polarization axes are orthogonal to each other corresponding to the rubbing directions are disposed on the incident side and on the back side of the device, if the voltage difference between both electrodes is zero, light is transmitted, while as the voltage difference between both electrodes is increased, light is blocked. Therefore, by controlling the voltage applied to the pixel electrode for each pixel, a predetermined display is enabled.

In the rubbing treatment, usually, by rotating a buffing cloth wound around a roller, the surface of an organic film, such as a polyimide, is rubbed in a predetermined direction (rubbing direction). By the rubbing treatment, it is believed that the polymer backbone of the organic film is drawn in the rubbing direction and the liquid crystal molecules are aligned in the drawing direction.

SUMMARY OF THE INVENTION

However, a difference in level of approximately 500 nm to 1,000 nm occurs in the underlying surface on which the alignment layer is formed, in particular, in the underlying surface of one substrate provided with pixel electrodes, switching elements, scanning lines, data lines, and peripheral circuits, due to the presence or absence of various types of wiring, various elements, and contact holes. Even if an alignment layer is formed on the underlying surface having such a difference in level, a difference in level also occurs in the surface of the alignment layer. Moreover, if such an alignment layer is subjected to rubbing treatment, since the tips of fibers implanted in the buffing cloth become disordered due to the difference in level, the surface of the substrate is rubbed nonuniformly. If a liquid crystal is filled and sealed between the substrates in which rubbing treatment has been performed nonuniformly, display unevenness occurs, presumably because the liquid crystal molecules are not aligned in a predetermined direction. Specifically, striped display unevenness may occur, resulting in a decrease in display quality.

Objects of the present invention are to at least provide an electro-optical device in which a difference in level in the surface of the substrate is minimized, and thus inconvenience in display resulting from nonuniform rubbing treatment is prevented, to provide a method for fabricating the same, and to provide an electronic apparatus using the same.

The present inventors had believed that the difference in level which degrades the display quality most is a difference in level caused by connection terminals for inputting various signals from external circuits and wiring extending from the connection terminals.

This will be described in more detail. Since pixel electrodes and switching elements connected thereto are provided corresponding to the individual intersections between scanning lines and data lines, the pitch of the array thereof depends on the pitch of the array of the scanning lines and data lines. Moreover, since peripheral circuits including sampling switches are provided corresponding to the scanning lines and the data lines, the pitch of the array of the elements constituting the peripheral circuits also depends on the pitch of the array of the scanning lines and data lines. Therefore, since display unevenness due to the differences in level of such elements and wiring occurs at the same pitch as that of the array of pixels or at an integral multiple thereof, these are believed to be not conspicuous in view of display.

In contrast, in view of decreasing the length of wiring extending from the connection terminals and in view of maintaining the symmetry of the overall device, the connection terminals are disposed close to the sampling switches and a data line drive circuit for driving the data lines, and are arrayed in the extending direction of the scanning lines (i.e., in a direction orthogonal to the extending direction of the data lines), and also in view of facilitating the connection to the exterior, the connection terminals are formed at a much larger pitch than that of the array of the scanning lines and data lines, i.e., are formed independently of the pitch of the array of scanning lines and data lines. Therefore, display unevenness due to the difference in level of the connection terminals and wiring leading to the connection terminals is believed to be highly conspicuous.

(1) Accordingly, in one exemplary aspect of the present invention, an electro-optical device includes a substrate composed of a plurality of layers, an insulating film formed on the outer surface of the substrate, connection terminals for inputting image signals formed at substantially the same level of the insulating film, and wiring connected to the connection terminals.

In such a structure, it is possible to minimize a difference in level between the surface of each connection terminal and the surface in the periphery thereof, and thus the tips of fibers implanted in a buffing cloth can be prevented from becoming disordered in rubbing treatment.

(2) In this aspect of the present invention, preferably, the electro-optical device further includes a recess for forming a region of each connection terminal provided in at least one of the layers constituting the substrate.

In such a structure, it is possible to minimize a difference in level between the surface of the connection terminal and the surface of the insulating film formed in the recess.

(3) In this aspect of the present invention, preferably, a conductive film constituting the connection terminal is provided in the recess for forming the region of the connection terminal.

In such a structure, even if a pattern for forming the conductive film deviates, since the recess can be used as a margin, the conductive film can be reliably formed in the region of the connection terminals.

(4) In this aspect of the present invention, preferably, a recess for forming the wiring, which is connected to the recess for forming the region of the connection terminals, is provided in at least one of the layers constituting the substrate in the region of the wiring at least on the connection terminal side.

In such a structure, a difference in level due to the wiring leading to the connection terminals can be minimized.

(5) In this aspect of the present invention, preferably, the insulating film formed on the outer surface of the substrate is formed in the region of the recess for forming the region of the connection terminals and in the region of the recess for forming the wiring.

In such a structure, a difference in level between the surface of the connection terminals and the surface of the insulating film as well as a difference in level of the wiring leading to the connection terminals can be minimized.

(6) In this aspect of the present invention, preferably, the connection terminals are composed of a multi-layered conductive film.

In such a structure, a lower conductive layer can be also used as a conductive layer in the pixel region and in the peripheral circuit, and an upper conductive layer can be formed using a material suitable for a connecting body to be connected to the connection terminal.

(7) In this aspect of the present invention, preferably, a film for adjusting height composed of at least one layer is formed in the region of the recess for forming the connection terminal.

In such a structure, it is possible to level the surface of the insulating film formed in the region of the recess by adjusting the depth of the recess and the thickness of the connection terminal.

(8) In this aspect of the present invention, preferably, the depth of the recess is substantially equal to the sum of the thickness of the connection terminal and the thickness of the film for adjusting the height.

In such a structure, since the surface of the conductive film of the connection terminal formed in the recess is substantially level with the reference level, the difference in level in the periphery of the connection terminal can be substantially eliminated.

(9) In this aspect of the present invention, preferably, the film for adjusting the height is at least one of wiring formed in a display region and wiring constituting a peripheral circuit.

In such a structure, the wiring formed in the display region and the wiring constituting the peripheral circuit are used in common, which is further advantageous to the process.

(10) Preferably, the depth of the recess is substantially equal to the thickness of the wiring.

In such a structure, the film for adjusting height is not required.

(11) In another exemplary aspect of the present invention, an electro-optical device includes a substrate composed of a plurality of layers, connection terminals for inputting image signals formed on the substrate, a recess provided in at least one of the layers constituting the substrate at least in a section of the region for forming wiring leading to each connection terminal, the wiring formed in the region corresponding to the recess, and an insulating film formed on the wiring.

In such a structure, the level of the surface of the wiring formed in the recess is lower than the level of the surface of the connection terminal (pad) by the depth of the recess. Therefore, since the difference in level between the insulating film formed on the wiring and the surface of the connection terminal is reduced, it is possible to prevent the tips of fibers implanted in the buffing cloth from becoming disordered during the rubbing treatment.

Additionally, the recess may be directly formed in the substrate or may be formed in a laminate on the substrate. As the wiring, a low-resistance metallic film, such as aluminum, is preferably used. In such a case, the wiring itself may be used as the pad, or a conductive film composed of a different material, such as ITO (Indium Tin Oxide) deposited on the wiring may be used as the pad.

(12) In this aspect of the present invention, preferably, the connection terminal is composed of a conductive film constituting the wiring, and the insulating film formed on the wiring exposes the connection terminal.

(13) In this aspect of the present invention, preferably, the surface of the connection terminal and the surface of the insulating film are substantially level with each other.

In such a structure, a difference in level of the wiring leading to the connection terminal can be substantially eliminated.

(14) In this aspect of the present invention, preferably, the recess is formed in the region surrounding the connection terminal, and the wiring is formed in the region surrounding the connection terminal.

In such a structure, the region of the connection terminal can be formed by the recess. Additionally, the adjacent connection terminals are not short-circuited.

(15) In this aspect of the present invention, preferably, the surface of the insulating film formed on the wiring and the surface of the insulating film adjacent to the region in which the wiring is formed are substantially level with each other.

In such a structure, the difference in level of the wiring can be substantially eliminated.

(16) In this aspect of the present invention, preferably, the wiring is composed of wiring formed in a display region.

In such a structure, since the wiring can be composed of the wiring formed in the display region, it is not necessary to increase the number of process steps.

(17) In this aspect of the present invention, preferably, the wiring is composed of wiring constituting a peripheral circuit formed in the periphery of a display region.

In such a structure, since the wiring can be composed of the wiring constituting the peripheral circuit, it is not necessary to increase the number of process steps.

(18) In this aspect of the present invention, preferably, the wiring is composed of wiring formed in a display region and wiring constituting a peripheral circuit formed in the periphery of the display region.

In such a structure, the wiring leading to the connection terminals, the wiring formed in the display region, and the wiring constituting the peripheral circuit are used in common, which is further advantageous to the process.

(19) In this aspect of the present invention, preferably, at least one film for adjusting height is formed in the region of the wiring.

In such a structure, it is possible to level the surface of the insulating film formed on the wiring by adjusting the depth of the recess and the thickness of the wiring.

(20) In this aspect of the present invention, preferably, the depth of the recess is substantially equal to the sum of the thickness of the wiring and the thickness of the film for adjusting height.

In such a structure, since the surface of the wiring formed corresponding to the recess is substantially level with the datum level, it is possible to substantially eliminate a difference in level of the wiring leading to the connection terminals.

(21) In this aspect of the present invention, preferably, the film for adjusting height is at least one of wiring formed in the display region and wiring constituting the peripheral circuit.

In such a structure, the wiring formed in the display region and the wiring constituting the peripheral circuit are used in common, which is further advantageous to the process.

(22) In this aspect of the present invention, preferably, the depth of the recess is substantially equal to the thickness of the wiring.

In such a structure, a film for adjusting height is not required.

(23) In another exemplary aspect of the present invention, an electro-optical device includes a substrate composed of a plurality of layers, a display region formed on the substrate, wiring arranged in the display region, peripheral circuits formed in the periphery of the display region and electrically connected to the wiring, connection terminals formed on the substrate, wiring for electrically connecting the peripheral circuits and the connection terminals to each other, a recess provided in at least one of the layers constituting the substrate at a section in which the peripheral circuits are formed, and an insulating film formed on the peripheral circuits.

In such a structure, since the upper surfaces of the peripheral circuits can be leveled with each other, it is possible to reduce display unevenness due to a difference in level on the peripheral circuits.

(24) In another exemplary aspect of the present invention, an electro-optical device includes a substrate composed of a plurality of layers, a display region formed on the substrate, wiring arranged in the display region, peripheral circuits formed in the periphery of the display region and electrically connected to the wiring, connection terminals formed on the substrate, wiring for electrically connecting the peripheral circuits and the connection terminals to each other, a recess provided in at least one of the layers constituting the substrate at a section in which the peripheral circuits are formed, a recess for forming the region of each connection terminal, and an insulating film formed in the regions of the recess for the peripheral circuits and the recess for forming the connection terminal so as to constitute an outer surface.

In such a structure, since the upper surface of the peripheral circuits and the periphery of the connection terminals can be leveled with each other, it is possible to reduce display unevenness due to the difference in level on the peripheral circuits and in the periphery of the connection terminals.

(25) In another exemplary aspect of the present invention, an electro-optical device includes a substrate composed of a plurality of layers, a display region formed on the substrate, wiring arranged in the display region, peripheral circuits formed in the periphery of the display region on the substrate and electrically connected to the wiring, connection terminals formed on the substrate, wiring for electrically connecting the peripheral circuits and the connection terminals to each other, a recess provided in at least one of the layers constituting the substrate at a section in which the wiring arranged in the display region is formed, a recess provided in at least one of the layers constituting the substrate at a section in which the peripheral circuits are formed, a recess for forming the region of each connection terminal, and an insulating film formed in the regions of the recess for the peripheral circuits and the recess for forming the region of the connection terminal so as to constitute an outer surface.

In such a structure, since the surface of the display region, the surface of the peripheral circuits, and the periphery of the connection terminals can be leveled with each other, it is possible to reduce display unevenness due to the difference in level on the display region, on the peripheral circuits, and in the periphery of the connection terminals.

(26) In another exemplary aspect of the present invention, an electro-optical device includes a substrate composed of a plurality of layers, a display region formed on the substrate, data lines arranged in the display region, a data line drive circuit formed along one side of the display region, connection terminals formed so as to face the one side of the display region with the data line drive circuit therebetween, signal lines electrically connected to the connection terminals for supplying image signals to the data lines, a recess provided in at least one of the layers constituting the substrate for forming the region of each connection terminal, and an insulating film constituting the outer surface of the substrate and exposing the connection terminals.

In such a structure, particularly, since the data line drive circuit and the periphery of the connection terminals can be leveled with each other, it is possible to reduce display unevenness due to the difference in level in the region thereof.

(27) In this aspect of the present invention, preferably, the electro-optical device further includes a recess provided in at least one of the layers constituting the substrate at least at a section in which the signal lines are formed in the region between the data line drive circuit and the connection terminals.

In such a structure, the difference in level at the section in which the signal lines are formed can be reduced.

(28) In this aspect of the present invention, preferably, the electro-optical device further includes a recess provided in at least one of the layers constituting the substrate at a section in which the data line drive circuit is formed.

In such a structure, it is possible to reduce display unevenness due to the difference in level of the data line drive circuit.

(29) In this aspect of the present invention, preferably, the electro-optical device further includes a sampling circuit provided between the one side of the display region and the data line drive circuit for controlling the supply of image signals to the data lines in the data line drive circuit.

(30) In this aspect of the present invention, preferably, a recess is provided in at least one of the layers constituting the substrate at a section in which the sampling circuit is formed.

In such a structure, it is possible to reduce display unevenness due to the difference in level of the sampling circuit.

(31) In this aspect of the present invention, preferably, an alignment layer is formed in the display region and the rubbing direction of the alignment layer is directed from the connection terminals to the display region.

In such a structure, by leveling the region between the data line drive circuit and the connection terminals which is formed independently of the pitch of the pixel array, it is possible to reduce the display unevenness which is relatively easily visible.

(32) In another exemplary aspect of the present invention, an electronic apparatus includes a light source for emitting light, an electro-optical device according to any one of the above-described exemplary aspects of the present invention in which light emitted from the light source is modulated in response to image information, and a projection unit for projecting the light modulated by the electro-optical device.

When an electro-optical device is used as a projection display device, even slight display unevenness is enlarged in a projected image so as to be visible. However, since the electronic apparatus of the present invention is provided with an electro-optical device in which the regions for forming the connection terminals and wiring leading thereto are planarized, it is possible to achieve high display quality in which display unevenness due to a difference in level is prevented.

(33) In another exemplary aspect of the present invention, a method for fabricating an electro-optical device, in which a predetermined image is displayed in response to signals inputted through connection terminals provided on a substrate composed of a plurality of layers, includes a step of forming a recess in at least one of the layers constituting the substrate at a section in which wiring leading to each connection terminal is to be formed, a step of forming the wiring in a region corresponding to the recess, and a step of depositing an insulating film on the wiring.

In such a method, in a manner similar to that in the first aspect of the present invention, a difference in level between the surface of the connection terminals and the surface of the insulating film as well as a difference in level of the wiring leading to the connection terminals can be reduced.

(34) In this aspect of the present invention, preferably, the connection terminals are formed simultaneously with the step of forming the wiring, and the method further includes the step of exposing the connection terminals covered by the insulating film subsequent to the step of depositing the insulating film.

In such a method, the difference in level in the periphery of the connection terminal can be reduced by a relatively simple process, such as etching.

(35) In this aspect of the present invention, preferably, the step of exposing the connection terminals is a step of polishing the insulating film.

In such a method, by using the surface of a conductive film constituting the connection terminal as a stopper, it is possible to perform substantially complete planarization relatively easily.

DETAILED DESCRIPTION OF PREFERRED EMBODIMENTS

The exemplary embodiments of the present invention will be described with reference to the drawings.

(General Structure of Electro-Optical Device)

Figure 1A:
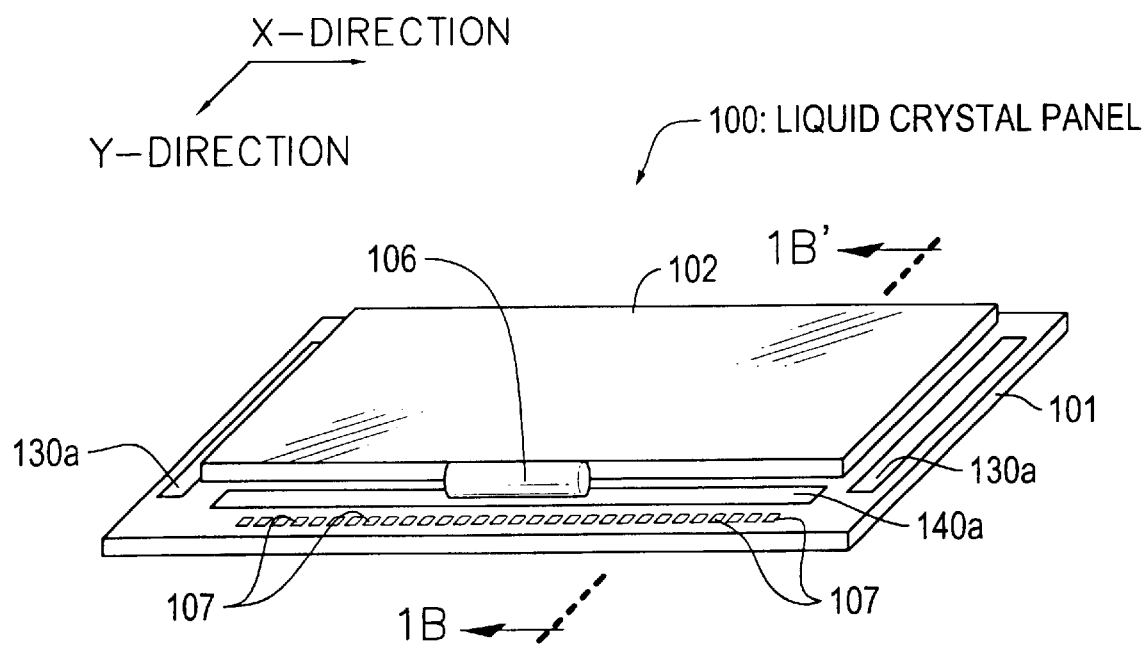
FIG. 1A is a perspective view showing the structure of a liquid crystal device as an electro-optical device in an exemplary embodiment of the present invention.
Figure 1B:
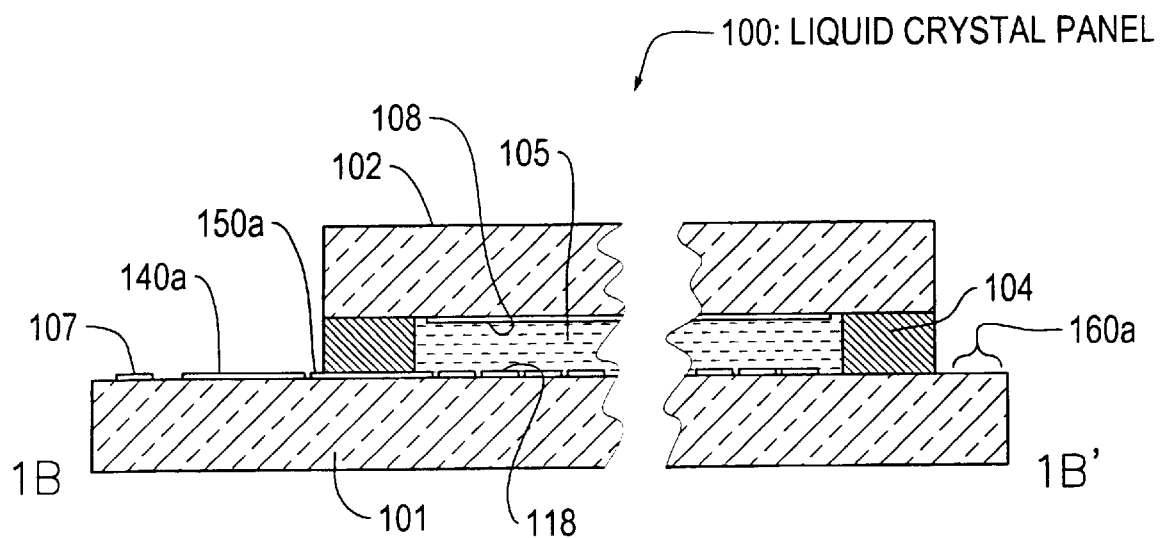
FIG. 1B is a sectional view taken along the line 1B–1B' of FIG. 1A.

First, an electro-optical device in an exemplary embodiment of the present invention will be described. The electro-optical device uses a liquid crystal as an electro-optical material, and performs a predetermined display by means of an electro-optical change of the liquid crystal. FIG. 1A is a perspective view of a liquid crystal panel 100 excluding external circuits, and FIG. 1B is a sectional view taken along the line 1B–1B' of FIG. 1A.

As shown in the drawings, in the liquid crystal panel 100, a device substrate 101 provided with various elements, pixel electrodes 118, etc., and a counter substrate 102 provided with a counter electrode 108, etc., are aligned so that the surfaces of the individual substrates having electrodes formed thereon face each other, and are sealed by a sealant 104 containing spacers (not shown in the drawing) with a predetermined gap therebetween. The gap is filled with an electro-optical material, such as a TN (Twisted Nematic) liquid crystal 105.

The device substrate 101 is composed of glass, quartz, silicon, or the like, and the counter substrate 102 is composed of glass, quartz, or the like. Additionally, when an opaque substrate is used as the device substrate 101, the device is used as a reflective display device instead of a transmissive display device. The sealant 104 is applied along the periphery of the counter substrate 102, and a portion thereof is left as a port for filling the liquid crystal 105. After the liquid crystal 105 is filled, the port is sealed by an end-sealing material 106.

A data line drive circuit, which will be described below, is formed on the inner surface of the device substrate 101 in a region 140a along one side of the sealant 104 so that sampling signals are outputted. Furthermore, along this side, in a region 150a in the vicinity of the sealant 104, image signal lines and a sampling circuit, which will be described below, are formed. On the other hand, in the outer periphery on this side, a plurality of connection terminals 107 are formed so that various signals are inputted from external circuits (not shown in the drawing).

In regions 130a along two sides adjacent to the side described above, scanning line drive circuits, which will be described below, are formed so that scanning lines are driven from both sides. Additionally, if delays in scanning signals supplied to the scanning lines present no problem, one scanning line drive circuit may be formed on one side.

In a region 160a along the remaining side, a pre-charge circuit, common wiring used for the two scanning line drive circuits, etc., are formed. The pre-charge circuit is used for pre-charging the individual data lines at a predetermined potential prior to sampling so that the load is decreased when image signals are sampled to the data lines. Since the pre-charge circuit does not directly relate to the present invention, further description thereof will be omitted.

The counter electrode 108 of the counter substrate 102 is electrically connected to the connection terminals 107 formed on the device substrate 101 by a conductive member provided at at least one corner out of four corners in the bonding section with the device substrate 101 as described below.

Additionally, a color layer (color filters) is provided on the counter substrate 102 in a region facing the pixel electrodes 118, and a light-shielding film is provided in the region other than the color layer in order to avoid a decrease in the contrast ratio due to leakage of light, and to surround a non-display region. However, when the liquid crystal device is used for modulating color light, such as in the case of a projector, which will be described below, it is not necessary to form a color layer on the counter substrate 102.

Additionally, regardless of whether the color layer is provided on the counter substrate 102 or not, the light-shielding film as described below is provided on the device substrate 101 in order to avoid degradation in the characteristics of the device due to light irradiation. Alignment layers (not shown in FIGS. 1A and 1B), which have been subjected to rubbing treatment so that the long axis directions of the molecules of the liquid crystal 105 are continuously twisted by approximately 90 degrees between the two substrates, are provided on the inner surfaces of the device substrate 101 and the counter substrate 102. Polarizers (not shown in the drawing) corresponding to the alignment directions are provided on the back surfaces thereof.

In FIG. 1B, although the counter electrode 108, the pixel electrodes 118, and the connection terminals 107 are illustrated with certain thickness for the purpose of clearly indicating the positions to be formed, the actual thickness are very small so as to be negligible in relation to the substrates. Furthermore, since the connection terminals 107 and the pixel electrodes 118 are formed on an insulating film which has been planarized as described below, a difference in level is substantially eliminated on the surface of the device substrate 101 facing the counter substrate 102.

(Electrical Configuration)

Figure 2:
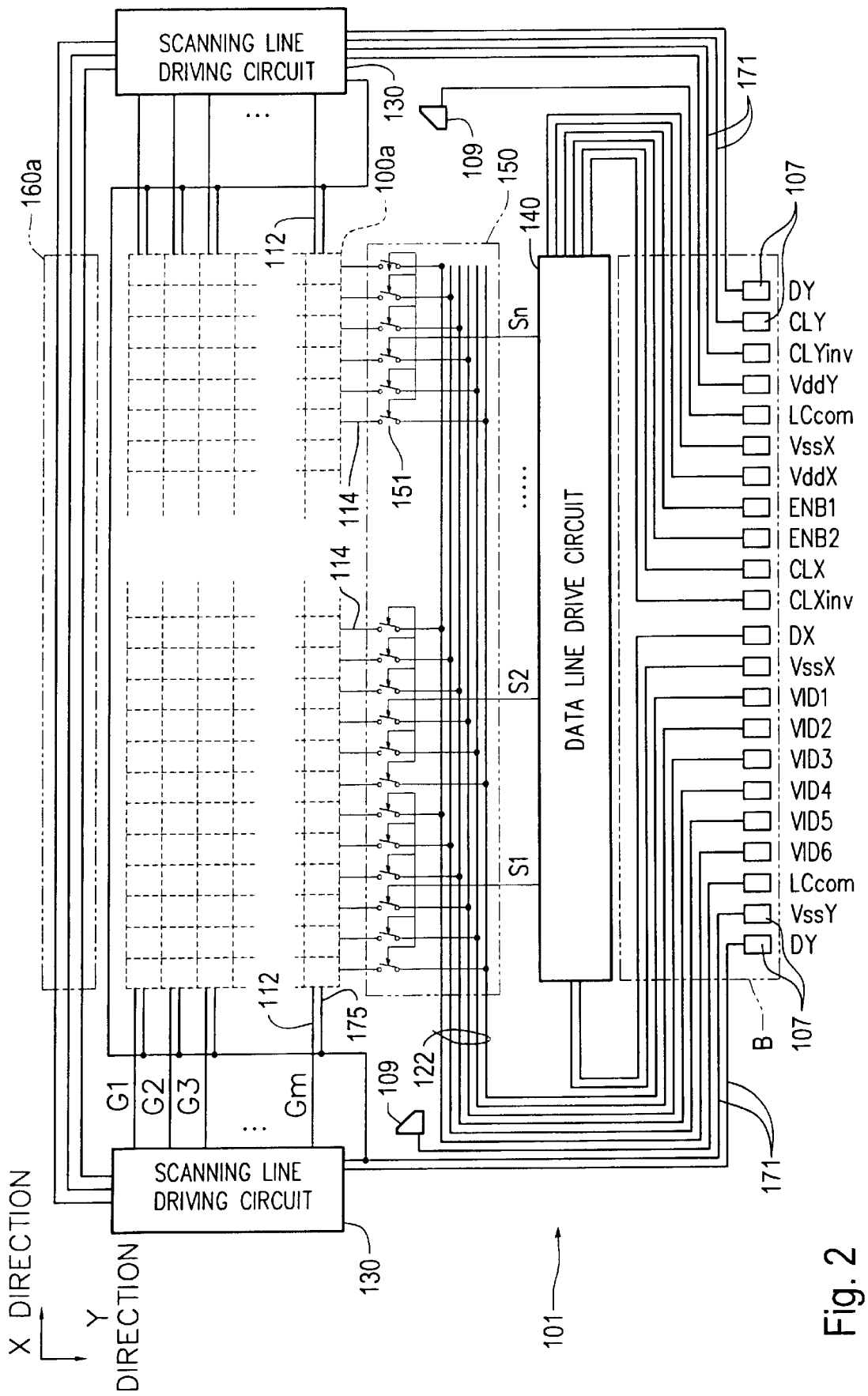
FIG. 2 is a block diagram showing the electrical configuration of the liquid crystal device in an exemplary embodiment of the present invention.

Next, the electrical configuration will be described with respect to the device substrate 101 in the liquid crystal device 100 described above. FIG. 2 is a schematic diagram showing the configuration.

Figure 4:
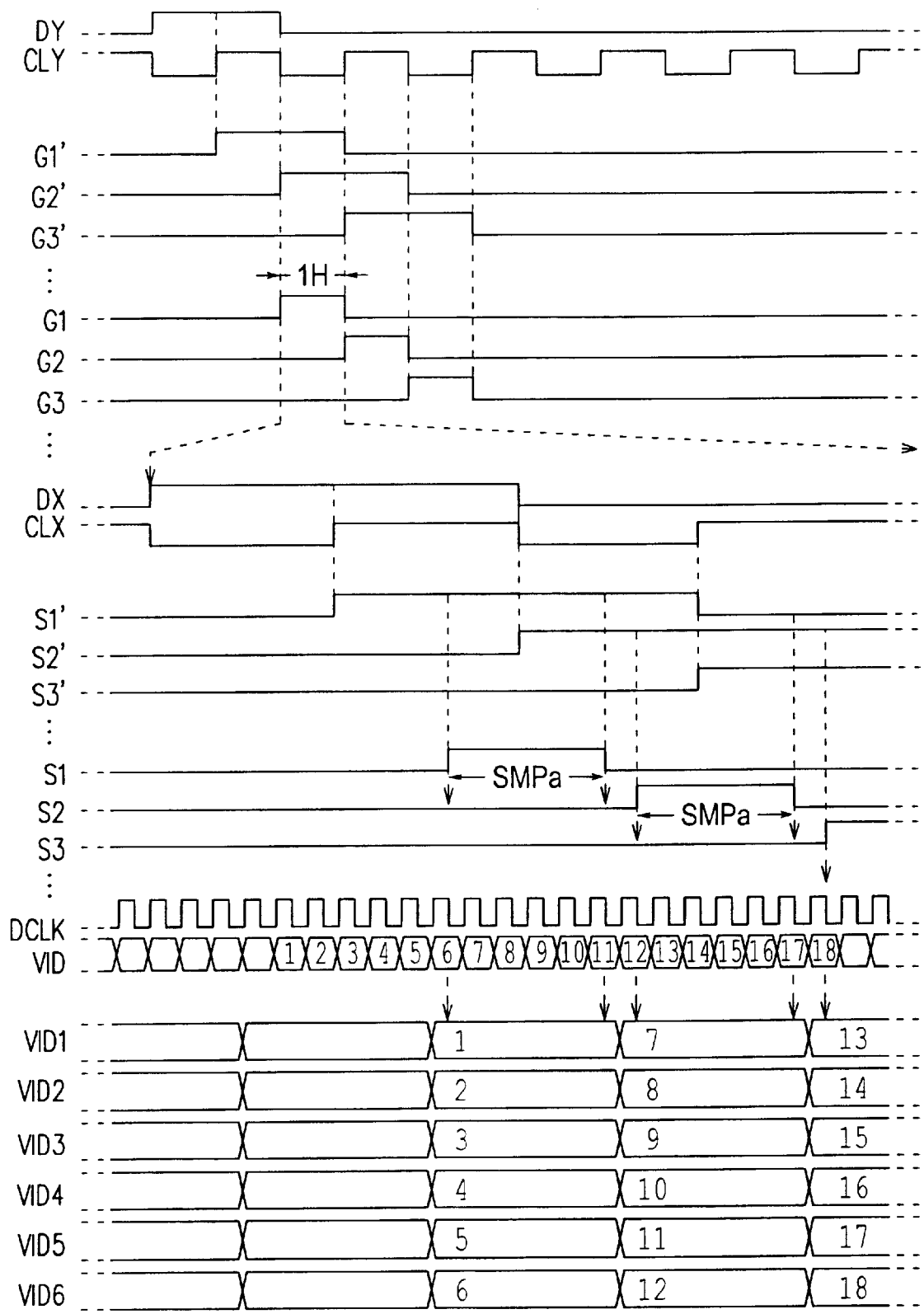
FIG. 4 is a timing chart which illustrates the operation of the liquid crystal device in an exemplary embodiment of the present invention.

As shown in the drawing, the device substrate 101 is provided with a plurality of connection terminals 107 for inputting various signals from external circuits. The signals inputted via the connection terminals 107 are supplied to the individual sections through wiring 171. The signals will be briefly described. Firstly, image signals VID1 to VID6, which are obtained, as shown in FIG. 4, by distributing an image signal VID of one system supplied synchronously with a dot clock DCLK into six systems and by expanding the VID six times in the time-base direction, are supplied to a sampling circuit 150 through six image signal lines 122. Additionally, the image signal lines 122 are particular lines constituting the wiring 171. That is, lines extending from the connection terminals 107 are generally referred to as the wiring 171, and among these, lines for supplying the image signals VID1 to VID6 are particularly referred to as the image signal lines 122.

Secondly, VssY and VssX are low-level-side voltages (ground potentials) of the power supplies of a scanning line drive circuit 130 and a data line drive circuit 140, respectively. VddY and VddX are high-level-side voltages of the power supplies of the scanning line drive circuit 130 and the data line drive circuit 140, respectively. Among these, the low-level-side voltage VssY of the power supply, which is the ground potential of a storage capacitor described below, is also supplied to the individual pixels via capacitor lines 175.

Thirdly, LCcom is a voltage signal to be applied to the counter electrode 108. Two electrodes 109 to which the voltage signals LCcom are supplied are provided on a position corresponding to a corner of the sealant 104 (refer to FIG. 1B) used for bonding with the counter substrate 102. Therefore, when the device substrate 101 and the counter substrate 102 are bonded together, the electrodes 109 and the counter electrode 108 are connected to each other with the conductive member therebetween, so that voltage signal LCcom is applied to the counter electrode 108. Additionally, the voltage signal LCcom is constant relative to the time base, and an external circuit performs alternating-current drive by dividing the image signals VID1 to VID6 into the high-level side and the low-level side, for example, for each horizontal scanning period, based on the voltage signal LCcom. Although the electrode 109 is provided at two spots in this embodiment, since the electrode 109 is provided only for the purpose of applying the voltage signal LCcom to the counter electrode 108 with the conductive member therebetween, the required number of spots at which the electrode 109 is provided is at least one. Therefore, the electrode 109 may be provided at one spot or at three spots or more.

Fourthly, as shown in FIG. 4, DY is a transfer start pulse which is supplied in the beginning of the vertical scanning period, and CLY is a clock signal used in the scanning line drive circuit 130. Additionally, CLYinv is an inverse clock signal in which the level of the clock signal CLY is inverted.

Fifthly, as shown in FIG. 4, DX is a transfer start pulse which is supplied in the beginning of the horizontal scanning period, and CLX is a clock signal used in the data line drive circuit 140. Additionally, CLXinv is an inverse clock signal in which the level of the clock signal CLX is inverted. As described below, ENB1 and ENB2 are enable signals for limiting the pulse width of each output signal of a shift register in the data line drive circuit 140.

In a display region 100a of the device substrate 101, a plurality of scanning lines 112 are arrayed in parallel in the row direction (in the X direction), and a plurality of data lines 114 are arrayed in parallel in the column direction (in the Y direction). A pixel is provided corresponding to each intersection thereof.

Figure 3:
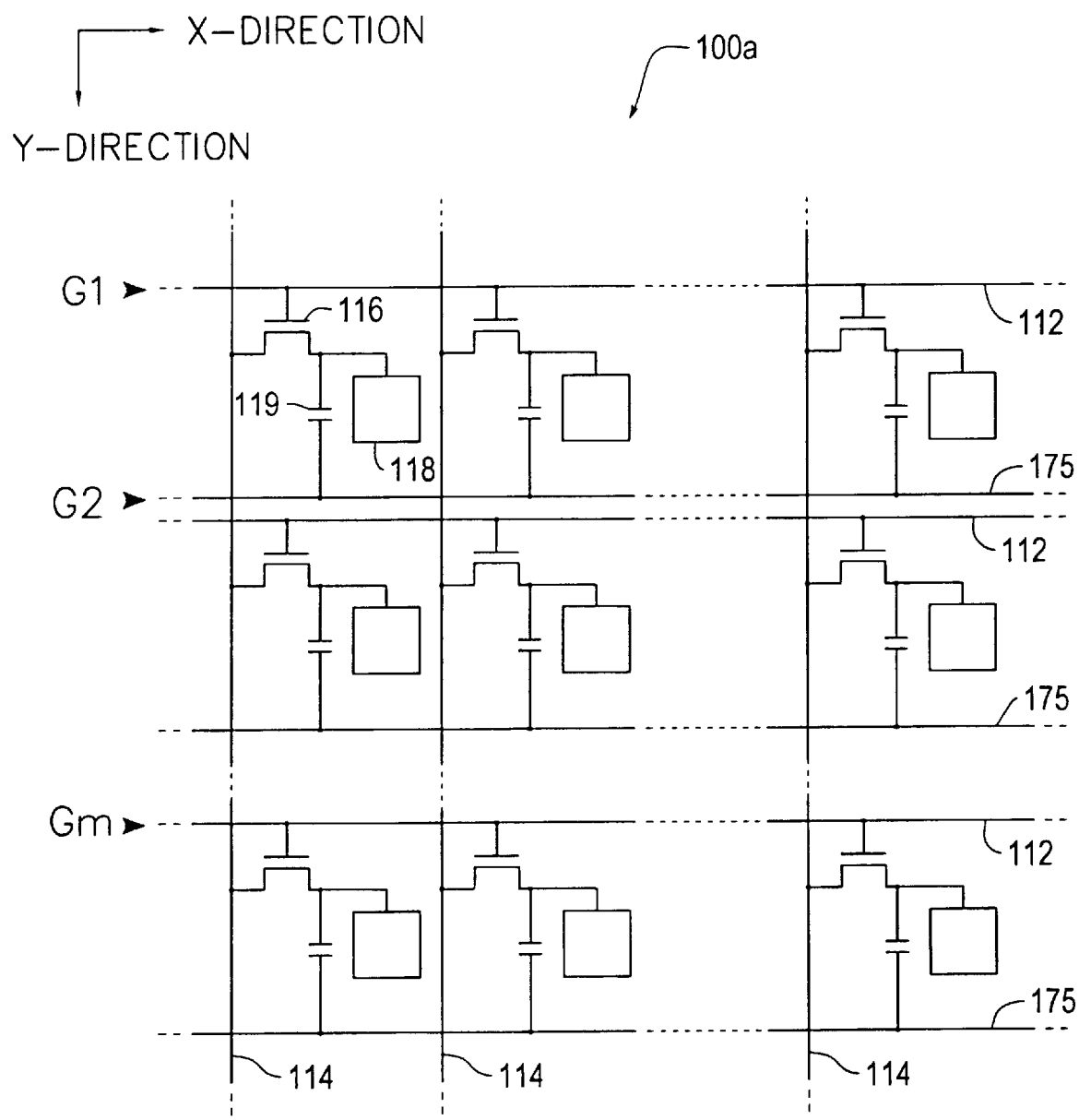
FIG. 3 is an equivalent circuit diagram in the display region of the liquid crystal device in an exemplary embodiment of the present invention.

Specifically, as shown in FIG. 3, at the intersection between the scanning line 112 and the data line 114, a gate of a TFT 116, which is a switching element for controlling the pixel, is connected to the scanning line 112, a source of the TFT 116 is connected to the data line 114, and a drain of the TFT 116 is connected to the transparent pixel electrode 118 which is rectangular-shaped.

As described above, in the liquid crystal device 100, since the liquid crystal 105 is interposed between the electrode-formed surfaces of the device substrate 101 and the counter substrate 102, a liquid crystal capacitor of each pixel is composed of the pixel electrode 118, the counter electrode 108, and the liquid crystal 105 interposed between these electrodes. Assuming that the total number of the scanning lines 112 is "m" and the total number of the data lines 114 is "6n", wherein m and n are integers, the pixels are arrayed in a matrix of m rows×6n columns corresponding to the individual intersections between the scanning lines 112 and the data lines 114.

In the display region 100a including the pixels arrayed in a matrix, a storage capacitor 119 for avoiding the leakage of the liquid crystal capacitance is also formed for each pixel. One end of each storage capacitor 119 is connected to the pixel electrode 118 (the drain of the TFT 116), and the other end is connected in common by a capacitor line 175. Therefore, since the storage capacitor 119 is electrically parallel to the liquid crystal capacitor, the data retention ability of the liquid crystal capacitor is improved, resulting in a high contrast ratio. Additionally, although the low level side voltage VssY of the power supply is applied to the capacitor line 175 in this embodiment, since what is required is to apply a constant voltage over time to the capacitor line 175, a high-level-side voltage VddY of the power supply, the voltage LCcom, or the like may be applied to the capacitor line 175. The detailed structure of the pixel including the storage capacitor 119 will be described below.

Referring back to FIG. 2, the scanning line drive circuit 130 outputs scanning signals G1, G2, . . . , Gm, which reach an active level in every horizontal scanning period 1 H in sequence, to the individual scanning lines 112 within one vertical effective display period. Although the detailed configuration thereof is not shown in the drawing because it does not directly relate to the present invention, the scanning line drive circuit 130 includes a shift register and a plurality of AND circuits. Among these, as shown in FIG. 4, the shift register shifts the transfer start pulse DY, which is provided first in the vertical scanning period, in sequence every time the level of the clock signal CLY (and the inverse clock signal CLYinv) is transformed (both in the rise and in the fall) to output signals G1', G2', G3', . . . , Gm'. The individual AND circuits calculate the logical products of adjacent signals and output scanning signals G1, G2, G3, . . . , Gm.

The data line drive circuit 140 outputs sampling signals S1, S2, . . . , Sn, which reach an active level in sequence, within a horizontal scanning period 1 H. Although the detailed configuration thereof is also not shown in the drawing because it does not directly relate to the present invention, the data line drive circuit 140 includes a shift register containing an inverter circuit, and a plurality of AND circuits. Among these, as shown in FIG. 4, the shift register shifts the transfer start pulse DX, which is provided in the beginning of the horizontal scanning period, in sequence every time the level of the clock signal CLX (and the inverse clock signal CLXinv) is transformed to output signals S1', S2', S3', . . . , Sn'. The individual AND circuits narrow the pulse widths of the signals S1', S2', S3', . . . , Sn' to a period SMPa, using the enable signal ENB1 or ENB2, so that the adjacent signals do not overlap with each other, and outputs sample signals S1, S2, S3, . . . , Sn.

Next, the sampling circuit 150 includes a sampling switch 151 provided on each data line 114. Six data lines 114 constitute a block, and among the six data lines 114 belonging to the ith block (where i is an integer from 1 to n) from the left in FIG. 2, the sampling switch 151 connected to an end of the data line 114 which is located in the farthest left samples the image signal VID1 supplied through the image signal line 122 during the period when the sampling signal Si is active, and supplies it to the relevant data line 114.

Similarly, among the six data lines 114 belonging to the ith block, the sampling switch 151 connected to an end of the data line 114 which is located in the second place samples the image signal VID2 supplied though the image signal line 122 during the period when the sampling signal Si is active, and supplies it to the relevant data line 114.

Similarly, among the six data lines 114 belonging to the ith block, the individual sampling switches 151 connected to the ends of the third, fourth, fifth, and sixth data lines 114 sample the image signals VID3, VID4, VID5, and VID6, respectively, during the period when the sampling signal Si is active, and supply them to the relevant data lines 114. That is, when the sampling signal Si reaches the active level, the image signals VID1 to VID6 are simultaneously sampled to the six data lines 114 belonging to the ith block.

The scanning line drive circuit 130, the data line drive circuit 140, the sampling circuit 150, etc., together with an inspection circuit for inspecting defects after fabrication, which are formed in the periphery of the display region 100*a*, are referred to as peripheral circuits. However, since the inspection circuit does not directly relate to the present invention, the description thereof will be omitted.

(Operation of Electro-Optical Device)

The operation of the electro-optical device having the structure described above will be briefly described.

First, the transfer start pulse DY is supplied to the scanning line drive circuit 130 in the beginning of the vertical scanning period. The transfer start pulse DY is shifted in sequence by the clock signal CLY (and the inverse clock signal CLYinv), and thus is outputted as scanning signals G1, G2, . . . , Gm, which reach the active level in sequence in each one horizontal scanning period, to the corresponding scanning lines 112, as shown in FIG. 4.

On the other hand, the image signal VID of one system is distributed into the image signals VID1 to VID6 of six systems by an external circuit, and is expanded six times in the time-base direction as shown in FIG. 4. The transfer start pulse DX is supplied to the data line drive circuit 140 in the beginning of the horizontal scanning period as shown in the drawing. The transfer start pulse DX is shifted in sequence every time the level of the clock signal CLX (and the inverse clock signal CLXinv) is transformed in the data line drive circuit 140 to produce signals S1', S2', . . . , Sn'. The signals S1', S2', . . . , Sn' are limited to the period SMPa in which the enable signals ENB1 and ENB2 are at the active level, and as shown in FIG. 4, are outputted in sequence as the sampling signals S1, S2, . . . , Sn.

In the period in which the scanning signal G1 is active, i.e., in the first horizontal scanning period, when the sampling signal S1 reaches the active level, the image signals VID1 to VID6 are sampled to the six data lines 114 belonging to the first block from the left. The image signals VID1 to VID6 are written by the TFTs 116 of the pixels located at the intersections between the first scanning line 112 from the top shown in FIG. 2 or 3 and the six data lines 114. Then, when the sampling signal S2 reaches the active level, the image signals VID1 to VID6 are sampled to the six data lines 114 belonging to the second block, and the image signals VID1 to VID6 are written by the TFTs 116 of the pixels located at the intersections between the first scanning line 112 and the six data lines 114.

Similarly, when the sampling signals S3, S4, . . . , Sn reach the active level in sequence, the image signals VID1 to VID6 are sampled to the six data lines 114 belonging to the third, fourth, . . . , nth blocks, respectively, and the image signals VID1 to VID6 are written by the TFTs 116 of the pixels located at the intersections between the first scanning line 112 and the six data lines 114. Thus, writing into all the pixels in the first line is complete.

Next, in the period in which the scanning signal G2 is active, i.e., in the second horizontal scanning period, writing into all the pixels in the second line is performed in the same manner as that described above. Similarly, the scanning signals G3, G4, . . . , Gm become active, and writing is performed into the pixels in the third, fourth, . . . , mth rows. Thus, writing into all the pixels in the first row to the mth row is complete.

In such a driving method, in comparison with a method in which each data line 114 is driven individually, since the time for sampling the image signal by each sampling switch 151 is increased by a factor of six, the charge and discharge time is sufficiently secured in the individual pixels, resulting in a high contrast ratio.

(Detailed Structure of Pixel)

Figure 5:
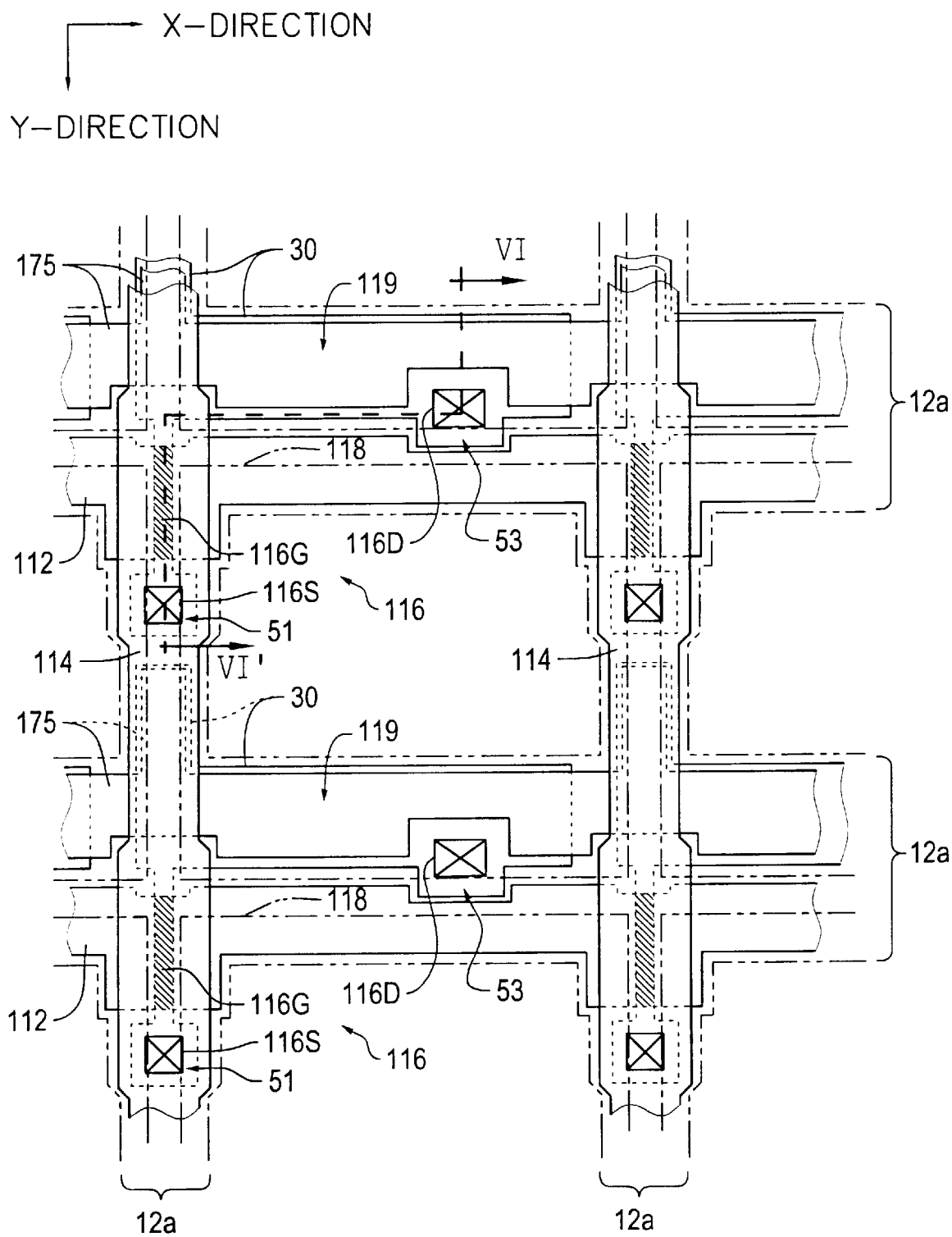
FIG. 5 is a plan view showing the detailed structure of a pixel in the display region of the liquid crystal device in an exemplary embodiment of the present invention.
Figure 6:
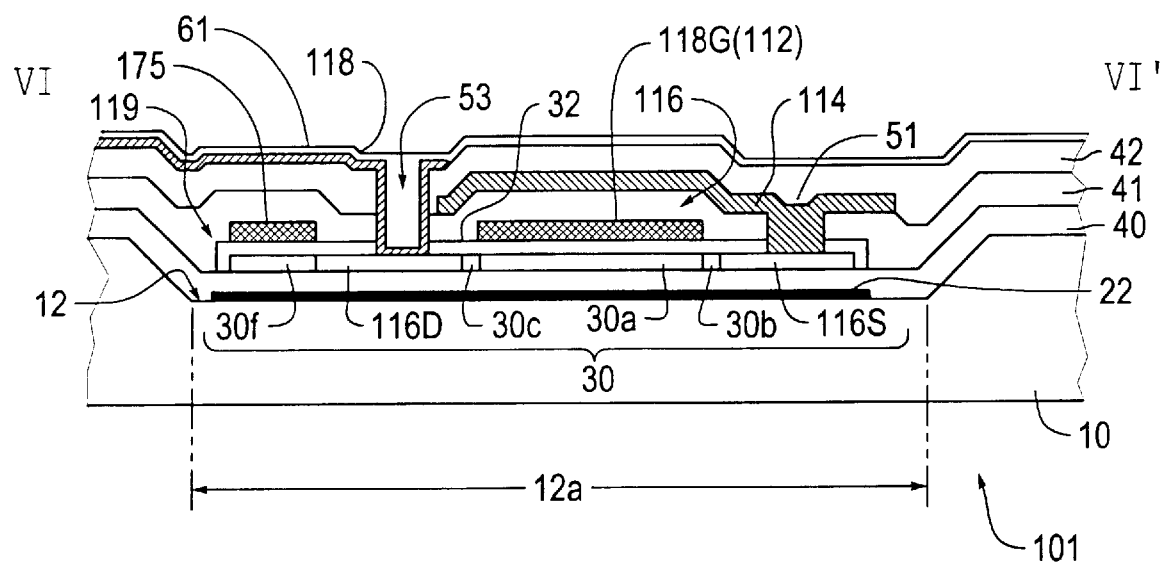
FIG. 6 is a sectional view taken along the line VI–VI' of FIG. 5.

Next, the details of the pixel described above will be described with reference to FIGS. 5 and 6. FIG. 5 is a plan view showing the detailed structure of the pixel, and FIG. 6 is a sectional view taken along the line VI–VI' of FIG. 5. In FIG. 5, only the outline of the pixel electrode 118, which is an outermost conductive layer, is indicated by a broken line in order to make it easy to understand the description.

As shown in the drawing, principal elements, such as the data line 114, the scanning line 112, the capacitor line 175, and the TFT 116, are formed in a recess 12 provided in a substrate 10 which is a base of the device substrate 101. In other words, the recess 12 is provided in a region 12*a* in which the data line 114, the scanning line 112, the capacitor line 175, TFT 116, etc., are to be formed.

A light-shielding film 22 is provided on the recess 12 so that light is prevented from entering into the TFT 116 from the lower side of the substrate 10. A semiconductor layer 30 composed of polysilicon is formed on the light-shielding film 22 with an underlying insulating film 40 therebetween, and the surface thereof is covered by an insulating film 32 formed by thermal oxidation.

The data line 114 extends in the Y direction and the scanning line 112 extends in the X direction. The capacitor line 175 extends in the X direction close to and in parallel to the scanning line 112, and at the section intersecting with the data line 114, the capacitor line 175 protrudes (upward in FIG. 5). In such a wiring structure, the semiconductor layer 30 extends from the intersection between the data line 114 and the capacitor line 175 in the extending direction of the capacitor line 175 (rightward in FIG. 5), in the protruding direction of the capacitor line 175 under the data line 114 (upward), and in a direction opposite thereto (downward), i.e., in three directions, thus being substantially formed in a T shape.

A portion of the semiconductor layer 30 overlapping the scanning line 112 corresponds to a channel region 30*a*. That is, a portion of the scanning line 112 intersecting with the semiconductor layer 30 is used as a gate electrode 116G. Furthermore, in the semiconductor layer 30, a lightly-doped source region 30*b* and a heavily-doped source region 116S are provided on the source side of the channel region 30*a*, and a lightly-doped drain region 30*c* and a heavily-doped drain region 116D are provided on the drain side of the channel region 30*a*, thus constituting a so-called LDD (Lightly Doped Drain) structure.

The heavily-doped source region 116S is connected to the data line 114 by a contact hole 51 made through the insulating film 32 and a first interlayer insulating film 41, while the heavily-doped drain region 116D is connected to the pixel electrode 118 by a contact hole 53 made through the insulating film 32, the first interlayer insulating film 41, and a second interlayer insulating film 42.

A portion of the heavily-doped drain region 116D in the semiconductor layer 30 acts as one electrode of the storage capacitor 119. That is, in the storage capacitor 119, a heavily-doped drain region 30f located under the capacitor line 175 acts as one electrode, and the capacitor line 175 itself acts as the other electrode, and the insulating film 32 formed on the semiconductor layer 30 is interposed between the two electrodes. In some cases, with respect to the storage capacitor 119, in addition to the capacitor in which the heavily-doped drain region 30f and the capacitor line 175 sandwich the insulating film 32, a capacitor in which the heavily-doped drain region 30f and the light-shielding film 22 sandwich the underlying insulating film 40 may also be used.

An alignment layer 61 composed of an organic film, such as a polyimide, is formed entirely over the outermost layer (i.e., a surface in contact with the liquid crystal 105). Additionally, the alignment layer 61 is subjected to the rubbing treatment as described above before bonding with the counter substrate 102 is performed.

As described above, the semiconductor layer 30 is formed in a hidden state under the region in which the scanning line 112, the data line 114, and the capacitor line 175 are formed. On the other hand, the light-shielding film 22 provided under the semiconductor layer 30 prevents light from entering from the lower side of the substrate 10. Therefore, the TFT 116 has a structure in which light does not easily enter both from the upper side and the lower side of the substrate 10, thus avoiding a change in the characteristics of the TFT 116 due to light irradiation.

Furthermore, in the display region 100a, since the elements, such as all the wiring (conductive films) and the semiconductor layer, other than the pixel electrode 118, are formed in the recess 12, swelling due to these elements is prevented. Therefore, in the display region 100a, a difference in level between the region in which the scanning line 112 and the data line 114 for supplying image signals to the pixel electrode 118 are formed and an aperture region not provided with them is reduced.

(Detailed Structure of Peripheral Circuit)

Figure 7:
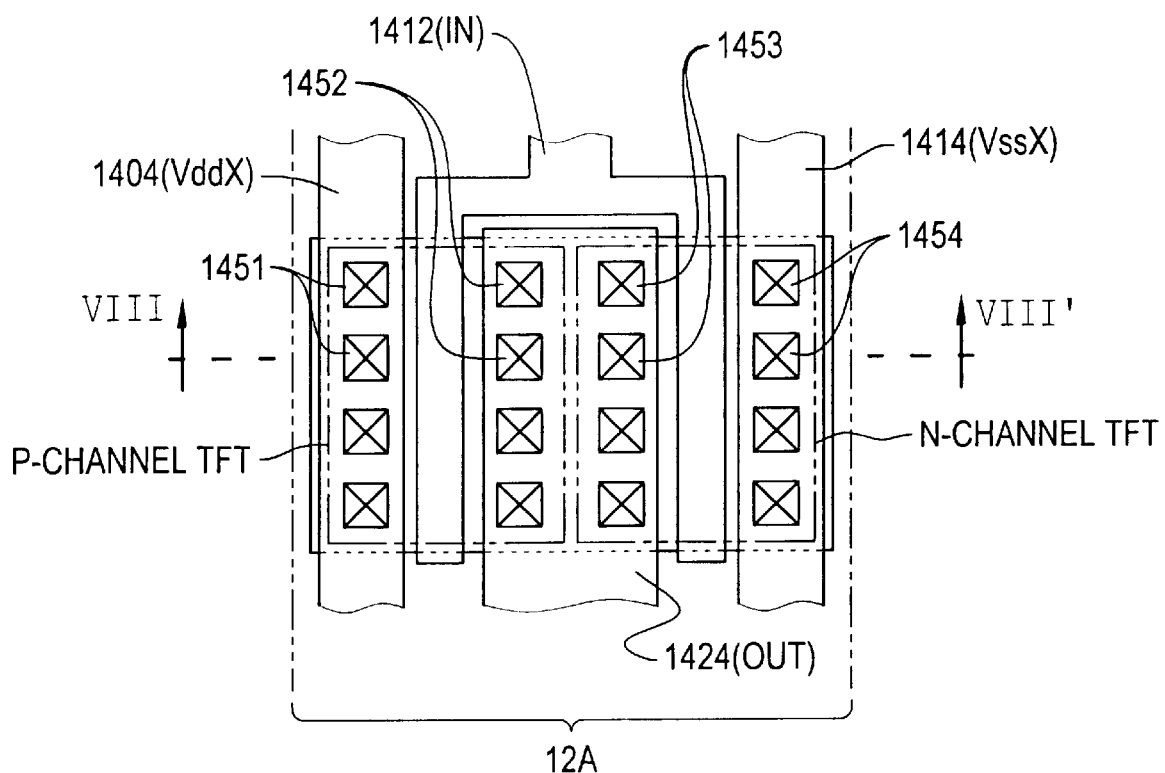
FIG. 7 is a plan view showing the detailed structure of an inverter circuit in the peripheral region of the liquid crystal device in an exemplary embodiment of the present invention.

The details of the peripheral circuits will be described based on an inverter contained in the shift register in the data line drive circuit 140, as an example of the peripheral circuit. FIG. 7 is a plan view of the inverter and FIG. 8 is a sectional view taken along the line VIII—VIII' of FIG. 7.

First, since the pixel electrodes 118 are not present in the peripheral circuit region in which the peripheral circuits are formed, the contact hole 53 is not made through the second interlayer insulating film 42, in contrast to the pixel region shown in FIG. 5 or 6. The light-shielding film 22 may be formed in a portion of the peripheral circuit region. Otherwise, the peripheral circuit region has basically the same structure as that of the pixel region, apart from the fact that the usage of wiring is different.

Figure 8:
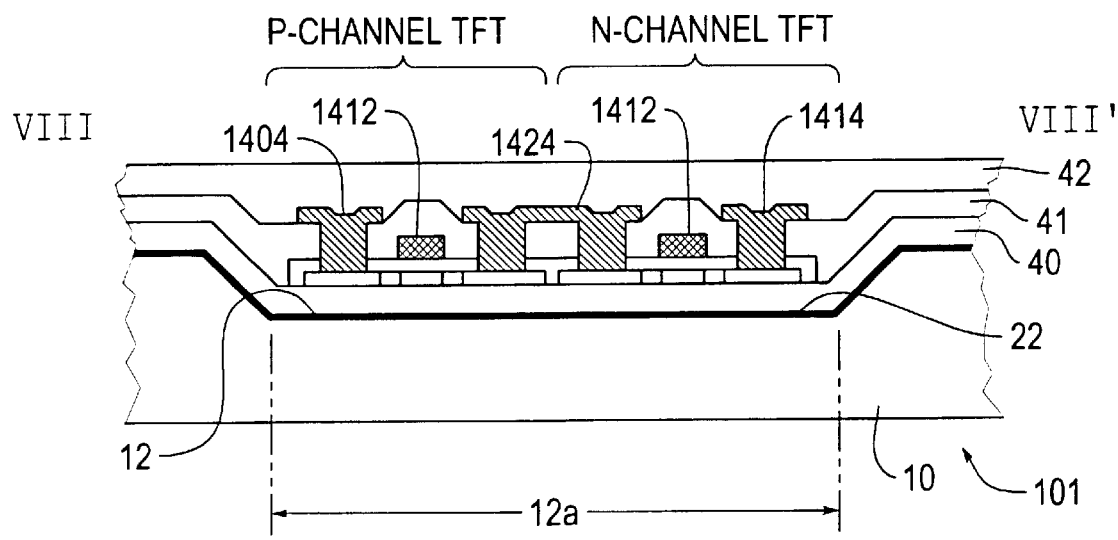
FIG. 8 is a sectional view taken along the line VIII–VIII' of FIG. 7.

That is, in the inverter shown in FIGS. 7 and 8, principal elements, such as wiring and semiconductor layers, are formed in a recess 12 provided in a substrate 10. The inverter has a complementary structure in which a p-channel TFT and an n-channel TFT having the LDD structure similar to that of the TFT 116 for switching the pixel electrode 118 are connected in series between a line 1404 to which the high-level-side voltage VddX of the power supply is applied and a line 1414 to which the low-level-side voltage VssX is applied. More specifically, the line 1404 is connected to a heavily-doped drain region of the p-channel TFT via a contact hole 1451, and the line 1414 is connected to a heavily-doped source region of the n-channel TFT via a contact hole 1454. Furthermore, a line 1412 to which inputting signals of the inverter are supplied branches off in the two directions to constitute a gate electrode shared by the p-channel TFT and the n-channel TFT. The heavily-doped source region of the p-channel TFT is connected via a contact hole 1452 and the heavily-doped drain region of the n-channel TFT is connected via a contact hole 1453 to a line 1424 for supplying outputting signals of the inverter.

Among those lines, the line 1412 corresponding to the gate electrode is formed by patterning the same conductive layer as that of the scanning line 112 in the display region, and the lines 1404, 1414, and 1424 are formed by patterning the same conductive layer as that of the data line 114 in the pixel region. That is, in the peripheral circuit region, a first layer for the line 1412 is formed using the same conductive layer as that of the scanning line 112 in the display region, and a second layer for the lines 1404, 1414, and 1424 is formed using the same conductive layer as that of the data line 114.

Although the inverter in the data line drive circuit 140 has been described as the example of the peripheral circuit, other elements in the data line drive circuit 140, such as a clocked inverter, an NAND gate constituting the AND circuit, and various elements in the scanning drive circuit 130 are also formed in the recess 12, in the same way as the inverter described above. Therefore, in the region in which the peripheral circuits are formed, a difference in level, due to the presence or absence of wiring and elements, is also reduced, the same as in the display region.

(Detailed Structure of Connection Terminal)

Figure 9:
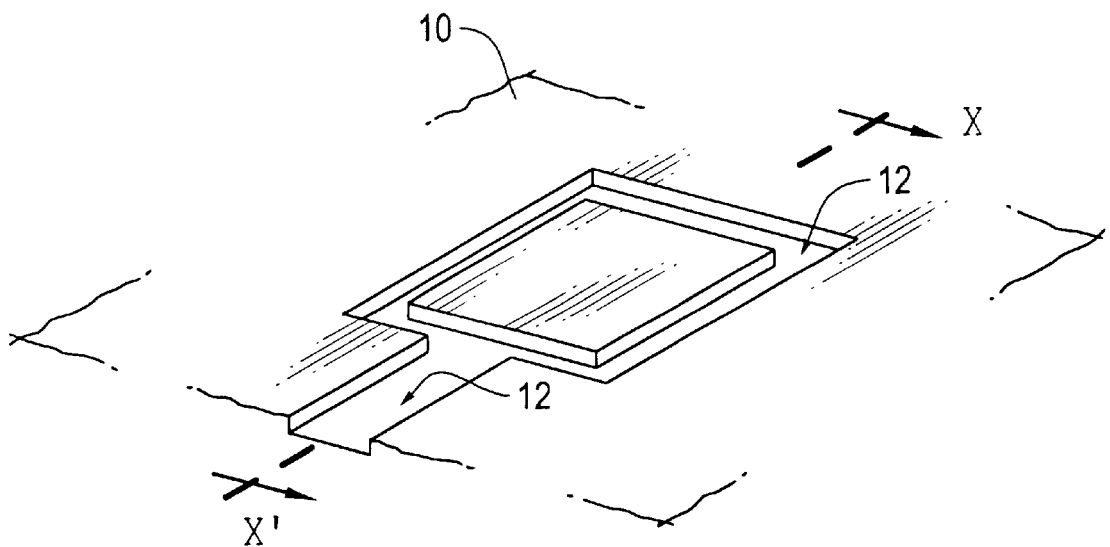
FIG. 9 is a perspective view showing the structure of a recess formed in the periphery of a connection terminal in the liquid crystal device in an exemplary embodiment of the present invention.
Figure 10:
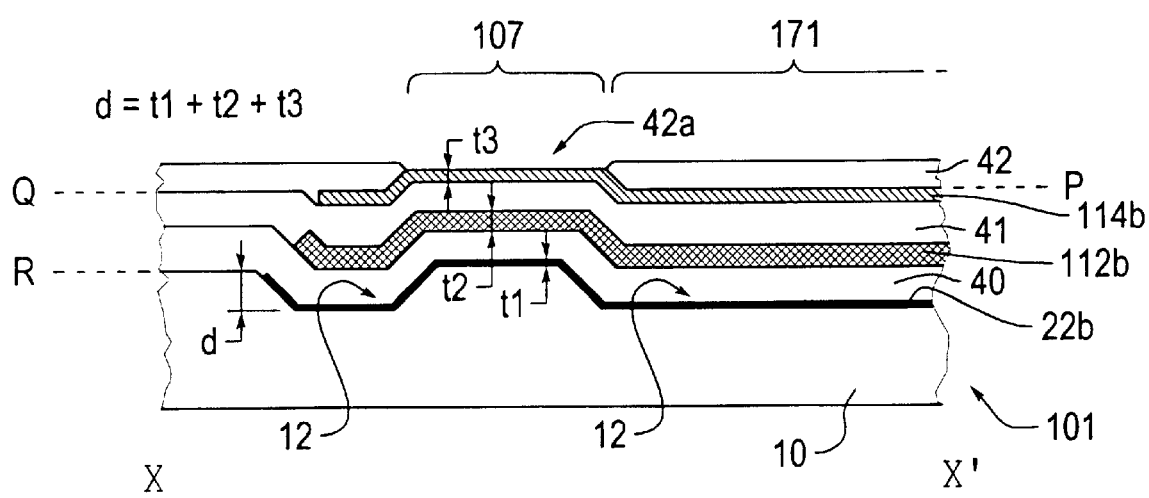
FIG. 10 is a sectional view taken along the line X–X' of FIG. 9, which shows the structure of the connection terminal and wiring leading to the connection terminal in the liquid crystal device.

The detailed structure of the connection terminals 107 will be described with reference to FIG. 10. FIG. 10 is a sectional view taken along the line X–X' of FIG. 9, and shows the structure of the connection terminal 107 and the wiring 171. As shown in FIG. 10, the connection terminal 107 and the wiring 171 are formed corresponding to the recess 12 formed in the substrate 10. As shown in FIG. 9, the recess 12 is formed in the surface of the substrate 10 corresponding to the peripheral (outline) section surrounding the region in which the connection terminal 107 is to be formed and the section in which the wiring 171 leading to the connection terminal 107 is to be formed.

As shown in FIG. 10, in the recess 12 and in the region surrounded by the outline section, a conductive film 22b, composed of the same layer as that of the light-shielding film 22 in the display region and in the peripheral circuit region, is formed. Although an underlying insulating film 40 is formed on the conductive film 22b and covers the entire surface of the substrate, the irregular section corresponding to the recess 12 formed in the substrate 10 still remains.

Next, on the underlying insulating film 40, a conductive film 112b, which is composed of the same layer as that of the scanning line 112 in the display region and that of the first layer for the line 1412 in the peripheral circuit region, is formed in the valley section corresponding to the recess 12 and in the peak section corresponding to the region surrounded by the outline section. Although a first interlayer insulating film 41 is formed on the conductive film 112b so as to cover the entire surface of the substrate, the irregular section corresponding to the recess 12 still remains.

Furthermore, in the valley section corresponding to the recess 12 and the peak section corresponding to the region surrounded by the outline section, a conductive film 114b, which is composed of the same layer as that of the data line 114 in the display region and that of the second layer for the lines 1404, 1414, and 1424 in the peripheral circuit region, is formed. Although a second interlayer insulating film 42 is formed on the conductive film 114b over the entire surface of the substrate, an opening 42a is provided in the peak section corresponding to the region surrounded by the outline section in the recess 12. That is, the conductive film 114b is exposed at the peak section corresponding to the region surrounded by the outline section in the recess 12, and is used as a pad of the connection terminal 107. On the other hand, the conductive film 114b leading to the protruding section is used as the wiring 171. In such a structure, since the surface of the conductive film 114b exposed in the opening 42a is swollen in comparison with the other section, a difference in level from the surface of the second interlayer insulating film 42 is reduced.

The depth d of the recess 12 from the reference level R of the substrate 10 is substantially equal to the sum of the thickness $t_1$ of the conductive film 22b, the thickness $t_2$ of the conductive film 112b, and the thickness $t_3$ of the conductive film 114b. Therefore, the surface P of the conductive film 114b formed in the recess 12 and the surface Q of the first interlayer insulating film 41 in the section in which the conductive films 22b, 112b, and 114b are not formed are substantially level with each other, and thus when the second interlayer insulating film 42 is formed thereon, the section in which the wiring 171 is formed and the section in which the wiring 171 is not formed are substantially planarized.

Although the conductive films 22b and 112b formed in the peak section corresponding to the region surrounded by the outline section of the recess 12 may appear to be electrically unnecessary, such conductive films are formed for the reasons described below. That is, in this embodiment, the recess 12 is also formed in the display region and the peripheral circuit region in addition to in the terminal region. From the viewpoint of simplifying the process, the recesses 12 are preferably formed simultaneously in the same step. In the display region and in the peripheral circuit region, by taking the thickness of the light-shielding film and the first and second layers for wiring into consideration, the depth of the recess 12 must be determined so that the surface of the second interlayer insulating film 42 is as planar as possible. On the other hand, in the connection terminal 107 and the wiring 171, although only the outermost conductive film 114b is required, if the conductive film 114b only is formed in the recess 12 in which the depth d is set in consideration of the thickness of the light-shielding film and the first and second layers for wiring, the depth of the recess 12 may become too great, resulting in a difference in level. Therefore, in the terminal region, in order to avoid such a difference in level, the light-shielding film and the first layer for wiring provided in the display region and the peripheral circuit region are used as dummy films for adjusting height. Additionally, since such a dummy film is used for the purpose of adjusting height, it is not limited to the conductive film, and an insulator may be formed independently.

In some cases, the conductive film 22b composed of the same film as the light-shielding film 22 may be relatively thin. In such a case, since a difference in level due to the presence or absence of the light-shielding film 22 and the conductive film 22b can be ignored, the conductive film 22b may not be provided in the terminal region. In this case, the depth d of the recess 12 is substantially equal to the sum of the thickness $t_2$ of the conductive film 112b and the thickness $t_3$ of the conductive film 114b. Furthermore, the recess 12 may be formed by also taking the thickness of the semiconductor layer 30 into consideration, and in such a case, the polysilicon layer constituting the semiconductor layer 30 may be used as a dummy film for adjusting height.

(Fabrication Process)

Next, the fabrication process of an electro-optical device in an embodiment of the present invention will be described by concentrating on a device substrate 101.

Figure 11A:
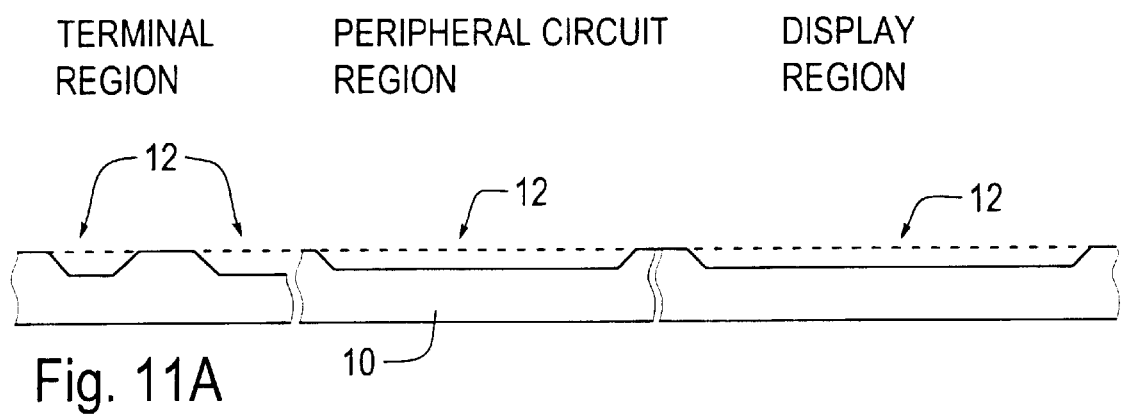
FIGS. 11A to 11D are sectional views showing the steps in the fabrication process of a device substrate in the liquid crystal device in an exemplary embodiment of the present invention.

First, as shown in FIG. 11A, recesses 12 are formed in a substrate 10 composed of quartz, glass, silicon, or the like by photolithography and etching, etc. Additionally, the depth d of the recess 12 is set to be substantially equal to the sum of the thickness of a light-shielding film, first and second layers for wiring as described above.

Figure 11B:
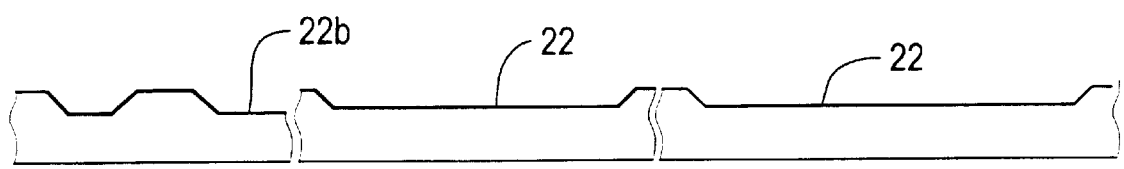

Next, as shown in FIG. 11B, a light-shielding film 22 and a conductive film 22b are formed on the substrate 10 provided with the recesses 12. Specifically, on the substrate 10 provided with the recesses 12, an opaque high-melting-point metal, for example, an elemental metal, such as Ti (titanium), Cr (chromium), W (tungsten), Ta (tantalum), Mo (molybdenum), or Pb (lead), or an alloy or a metal silicide including at least one of them, is deposited by sputtering or the like at a thickness of approximately 100 to 300 nm, and then the high-melting-point metal is patterned into the shapes described above to form the light-shielding film 22 and the conductive film 22b.

Figure 11C:
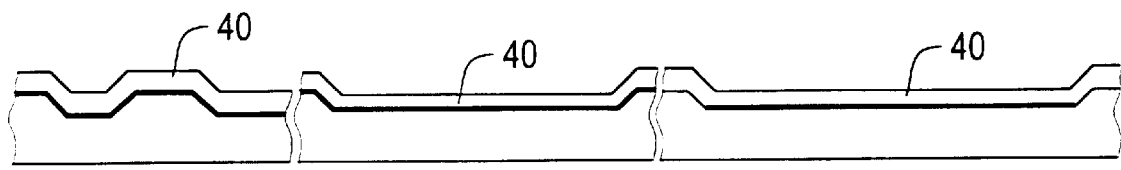

Next, as shown in FIG. 11C, an underlying insulating film 40 is formed on the light-shielding film 22, the conductive film 22b, and the substrate 10. Specifically, the underlying insulating film 40 is formed of highly insulating glass, such as NSG (non-doped silicate glass), PSG (phosphosilicate glass), BSG (borosilicate glass), or BPSG (borophosphosilicate glass), a silicon oxide film, or a silicon nitride film, by atmospheric pressure or low pressure CVD (Chemical Vapor Deposition) or the like at a thickness of approximately 50 to 1,500 nm, and preferably at a thickness of approximately 600 to 800 nm.

Figure 11D:
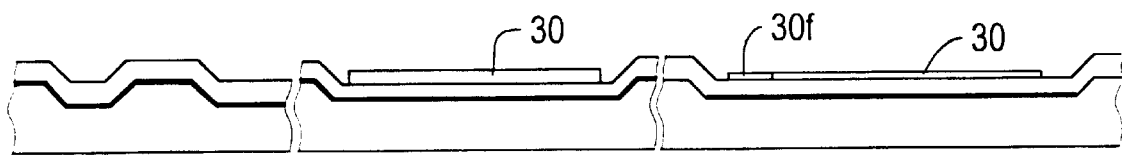

Next, over the entire upper surface of the underlying insulating film 40, an amorphous silicon layer is formed at a thickness of approximately 100 nm, for example, by low pressure CVD, and then heat treatment or the like is performed to form a polysilicon film by solid phase growth. At this stage, when an n-channel TFT is formed, impurities of group V elements, such as Sb (antimony), As (arsenic), and P (phosphorus), are slightly doped by ion implantation or the like, and when a p-channel TFT is formed, impurities of group III elements, such as Al (aluminum), B (boron), and Ga (gallium), are slightly doped by ion implantation or the like. As shown in FIG. 11D, the polysilicon layer is patterned by photolithography, etching, etc. into island-shaped elements, such as a TFT 116 in the display region and a semiconductor layer 30 in the peripheral circuit region. Additionally, with respect to a region 30f of the semiconductor layer 30 in which a capacitor line 175 is to be formed, impurities such as P (phosphorus) may be doped at a heavily-doped to preliminarily decrease the resistance.

Figure 12A:
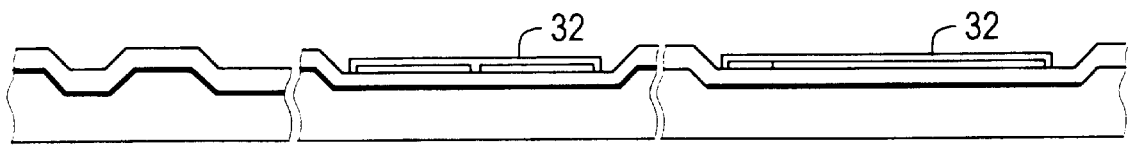
FIGS. 12A to 12D are sectional views showing the subsequent steps in the fabrication process of the device substrate in the liquid crystal device in the embodiment of the present invention.

Furthermore, as shown in FIG. 12A, the surface of the semiconductor layer 30 is subjected to thermal oxidation treatment to form an insulating film 32 on the surface of the semiconductor layer 30. By this step, the semiconductor layer 30 finally has a thickness of approximately 30 to 150 nm, and preferably a thickness of approximately 35 to 45 nm, while the insulating film 32 has a thickness of approximately 60 to 150 nm, and preferably a thickness of approximately 30 nm.

Figure 12B:
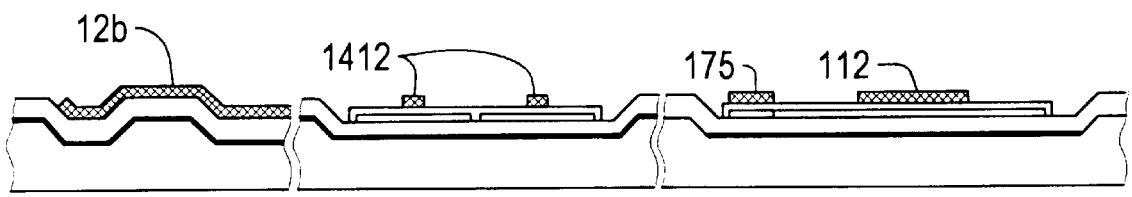

Next, on the upper surface of the insulating film 32 and the underlying insulating film 40, a polysilicon layer is deposited by low pressure CVD or the like. As shown in FIG. 12B, the polysilicon layer is patterned by photolithography, etching, etc., to form a scanning line 112 which also acts as a gate electrode of the TFT 116 and a capacitor line 175 constituting one electrode of a storage capacitor 119 in the display region, to form a line 1412 in a first layer including a gate electrode in the peripheral circuit region, and to form a conductive film 112b in the terminal region. Additionally, the conductive film may be composed of a metallic film such as Al or a metal silicide film, instead of polysilicon, and may be a multi-layered film including polysilicon and the metallic film or the metal silicide film.

Figure 12C:
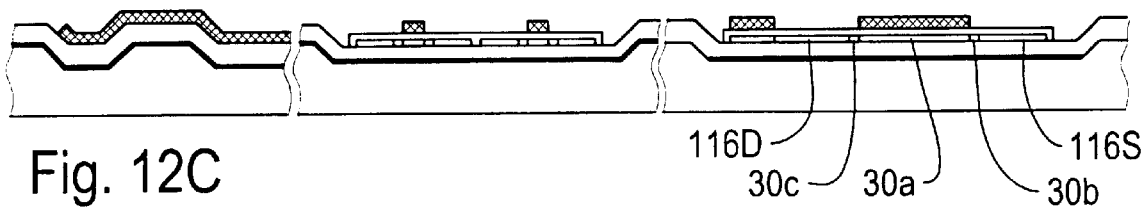

Furthermore, as shown in FIG. 12C, appropriate impurities are doped into the semiconductor layer 30. More specifically, when an n-channel TFT 116 is formed in the display region, impurities of group V elements such as P is doped at a lightly-doped into a region adjacent to a channel region 30a in the source and drain regions using the gate electrode, which is a portion of the scanning line 112, as a diffusion mask. Simultaneously, with respect to an n-channel TFT in the peripheral circuit region, impurities are also doped at a lightly-doped using the gate electrode, which is a portion of the line 1412, as a diffusion mask. A resist layer which is wider than the gate electrode is then formed, and using this as a mask, impurities of group V elements such as P are doped at a heavily-doped. Thus, the n channel TFT has an LDD structure in which a lightly-doped source region 30b and a heavily-doped source region 116S are provided in the source side of the channel region 30a, and a lightly-doped drain region 30c and a heavily-doped drain region 116D are provided in the drain side of the channel region 30a. Next, after the n-channel TFTs are masked by a resist, with respect to a p-channel TFT in the peripheral circuit region, similarly, impurities of group III elements such as B (boron) are doped into a region adjacent to the channel region using the line 1412 as a mask to form a lightly-doped region, and then using a resist layer which is wider than the line 1412 as a mask, impurities of group III elements such as B are doped to form a heavily-doped region.

Additionally, the individual channel TFTs may have an offset structure instead of the LDD structure, or a TFT of the self-aligned type may be used. Among the complementary TFTs in the peripheral circuits, only the n channel TFTs may have the LDD structure, and also the TFTs 116 in the pixel region may have the complementary structure.

Figure 12D:
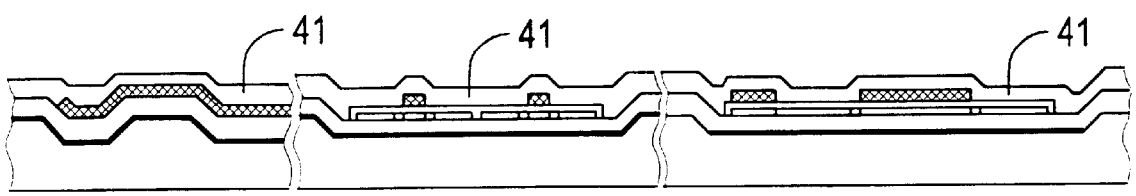

Next, as shown in FIG. 12D, a first interlayer insulating film 41 is deposited so as to cover the gate electrode and the underlying insulating film 40 by CVD or the like at a thickness of approximately 500 to 1,500 nm. Additionally, examples of the material for the first interlayer insulating film 41 include silicate glass films, such as NSG, PSG, BSG, and BPSG, a silicon nitride film, and a silicon oxide film, in the same way as the underlying insulating film 40.

Figure 13A:
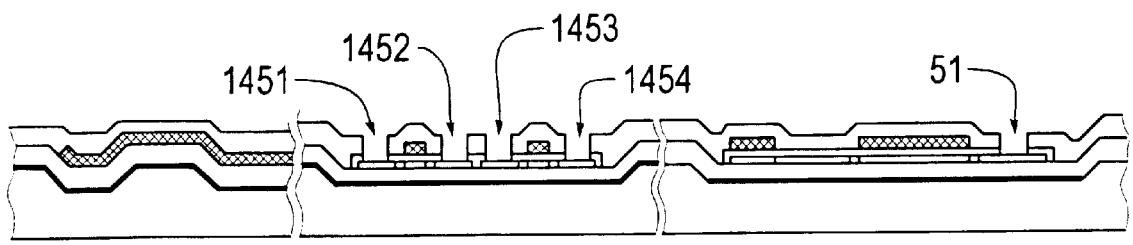
FIGS. 13A to 13D are sectional views showing the subsequent steps in the fabrication process of the device substrate in the liquid crystal device in the embodiment of the present invention.

Furthermore, as shown in FIG. 13A, a contact hole 51 is formed in the display region and contact holes 1451, 1452, 1453, and 1454 are formed in the peripheral circuit region. More specifically, the contact hole 51 is made through the first interlayer insulating film 41 and the insulating film 32 at a position corresponding to the source region of the TFT 116 by dry etching, etc., and the contact holes 1451, 1452, 1453, and 1454 are formed at positions corresponding to the heavily-doped drain regions and the heavily-doped source regions in the p-channel and n-channel TFTs. Additionally, at this stage, when the wiring in the first layer and the wiring in the second layer are electrically connected to each other, a contact hole (not shown in the drawing) is also formed corresponding to the connecting section.

Figure 13B:
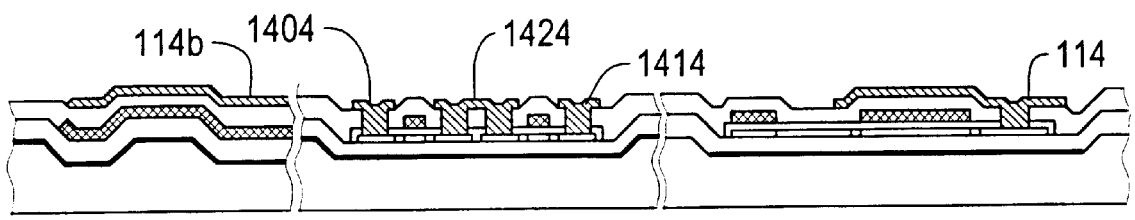

Next, a conductive film composed of a low-resistance metal, such as aluminum, or a metal silicide is deposited on the first interlayer insulating film 41 by sputtering or the like at a thickness of approximately 100 to 500 nm. As shown in FIG. 13B, the conductive film is then patterned by photolithography, etching, etc., to form a data line 114 which also acts as the source electrode of the TFT 116 in the display region, to form the second layer lines 1404, 1414, and 1424 including source and drain electrodes in the peripheral circuit region, and to form a conductive film 114b in the terminal region.

Figure 13C:
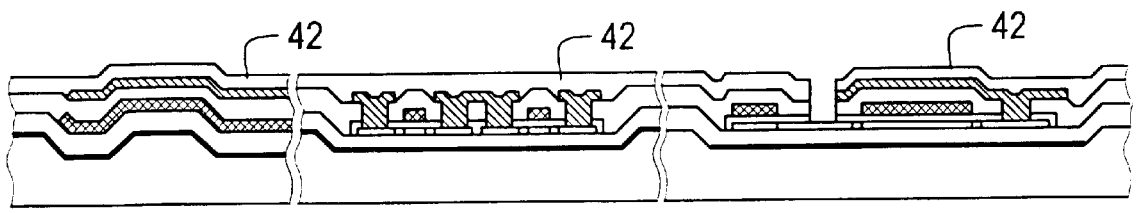

Next, as shown in FIG. 13C, a second interlayer insulating film 42 is deposited so as to cover the second layer lines and the first interlayer insulating film 41 by CVD or the like at a thickness of approximately 500 to 1,500 nm. Additionally, examples of the material for the second interlayer insulating film 42 include silicate glass films, such as NSG, PSG, BSG, and BPSG, a silicon nitride film, and a silicon oxide film, in the same way as the underlying insulating film 40 and the first interlayer insulating film 41.

Figure 13D:
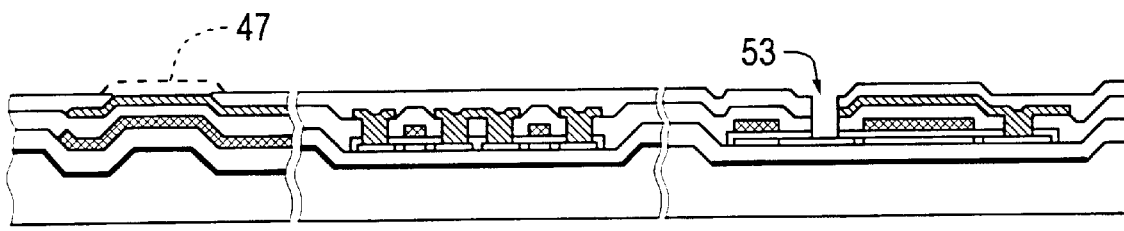

Next, as shown in FIG. 13D, a contact hole 53 is made through the second interlayer insulating film 42, the first interlayer insulating film 41, and the insulating film 32, at a position corresponding to the drain region of the TFT 116 in the display region, by dry etching, etc. On the other hand, in the terminal region, a portion 47 of the second interlayer insulating film 42 located at the peak section surrounded by the section corresponding to the outline of the recess 12 is removed to form an opening 42a.

Methods for forming the opening 42a are classified into two techniques. In a first method, a portion of the second interlayer insulating film 42 corresponding to the opening 42a is selectively removed by etching, etc. In a second method, the second interlayer insulating film 42 is subjected to CMP (chemical mechanical polishing) until the conductive film 114b in the peak section corresponding to the region surrounded by the outline section of the recess 12 is exposed. Among them, the second method is advantageous in view of the fact that the section for forming the connection terminal 107 and the other section are almost completely planarized. However, the first method is advantageous in view of simplifying the process because the portion of the second interlayer insulating film 42 corresponding to the opening 42a can be more selectively removed in a manner similar to that for forming the contact hole 53.

Figure 14:
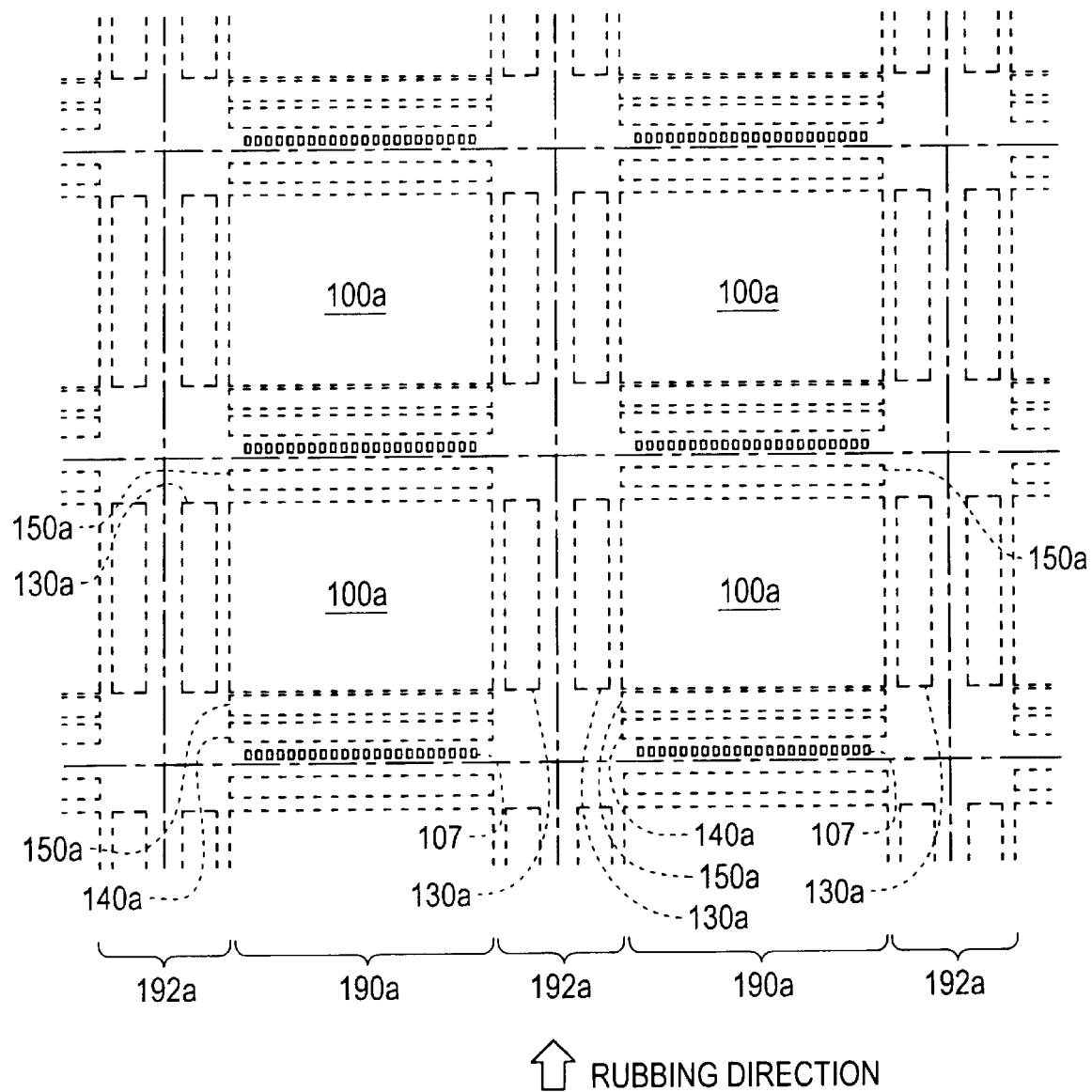
FIG. 14 is a plan view which shows the rubbing direction of the device substrate in the liquid crystal device in an exemplary embodiment of the present invention.

Although the subsequent steps are not shown in the drawing, a transparent conductive thin film, such as ITO, is deposited on the surface of the second interlayer insulating film 42 by sputtering or the like at a thickness of approximately 50 to 200 nm, and then patterning is performed into a predetermined shape (refer to FIG. 5) by photolithography, etching, etc. to form pixel electrodes 118. An organic solution, such as a polyimide, is applied over the entire surface of the substrate 10 facing the other substrate, followed by firing. Thus, an alignment layer 61 is formed. Additionally, the alignment layer 61 is subjected to rubbing treatment in a direction as shown in FIG. 14.

The device substrate 101 fabricated as described above is bonded with a counter substrate 102, which is subjected to rubbing treatment in a direction rotated by approximately 90 degrees from that of the device substrate 101, by a sealant 104, and then a liquid crystal 105 is injected and sealed, followed by scribing, and an electro-optical device as shown in FIG. 1A is obtained.

Additionally, although the alignment layer 61 is formed on the entire surface of the device substrate 101, after the liquid crystal is sealed, the alignment layer 61 formed in the section protruding from the counter substrate 102 is removed. Therefore, the outermost layer in the terminal region or the peripheral circuit region is the conductive film 114b or the second interlayer insulating film 42 instead of the alignment layer 61 (refer to FIG. 8 or 10).

In accordance with the method described above, since the recesses 12 are also formed in the display region and the peripheral circuit region in addition to the terminal region, and wiring and elements are formed therein, a difference in level in the surface of the substrate is also reduced in the display region and the peripheral circuit region in addition to the terminal region. The conductive film 22b for adjusting height provided under the conductive film 114b corresponding to the pad of the connection terminal 107 is formed of the same layer as that of the light-shielding film 22 in the display region and the peripheral circuit region. The conductive film 112b for adjusting height is formed of the same layer as that of the scanning line 112 in the display region and that of the line 1412 in the peripheral circuit region. The conductive film 114b is formed of the same layer as that of the data line 114 in the display region and that of the lines 1404, 1414, and 1424 in the peripheral circuit region. Moreover, the recesses 12 are simultaneously provided in the display region and the peripheral circuit region in addition to the terminal region. Consequently, since almost no new process is added, it is possible to avoid complications of the fabrication process.

(Modified Embodiment)

Figure 15:
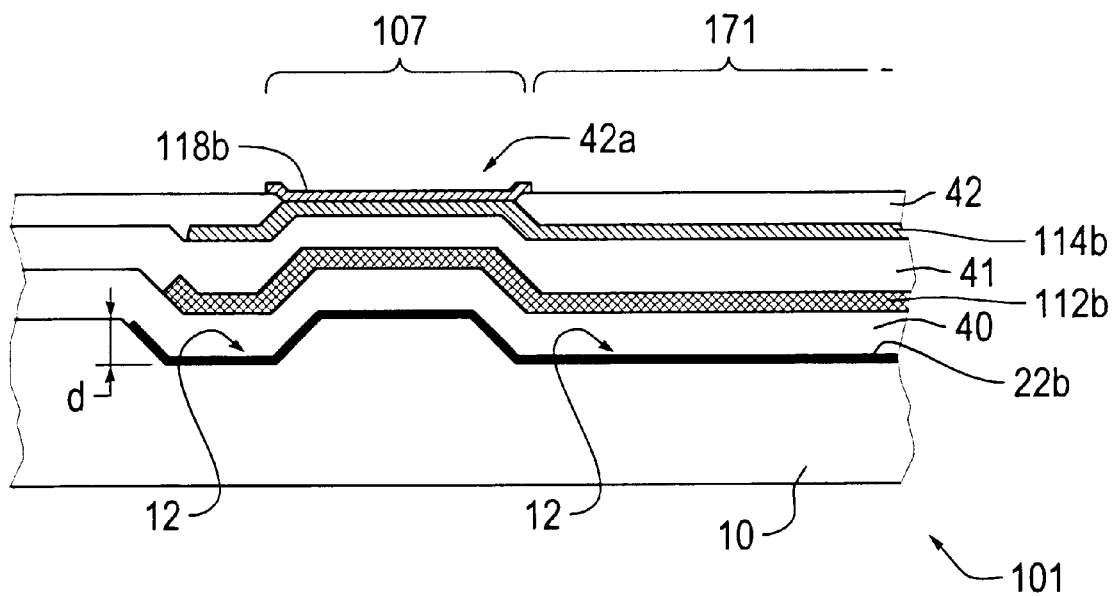
FIG. 15 is a sectional view showing a connection terminal and wiring leading to the connection terminal in a modified exemplary embodiment of the present invention.

Although the pad corresponding to the connection terminal 107 is formed of the same conductive film 114b as that of the data line 114 and that of the line 1404 in the second layer in the embodiment described above, another conductive film may be deposited further thereon. For example, as shown in FIG. 15, when the pixel electrode 118 is patterned, a conductive film 118b composed of ITO or the like may be left on the conductive film 114b in the peak section surrounded by the section corresponding to the outline of the recess 12. As described above, the conductive film 114b is composed of aluminum or the like, and aluminum is easily corroded and has poor adhesion to conductive microcapsules used for bonding with a FPC (Flexible Printed circuit) board. However, such problems are overcome by further covering the surface of the exposed conductive film 114b by the conductive film 118b.

(Application)

In the embodiment described above, the recesses 12 are also formed in the display region and the peripheral region in addition to the terminal region. As described above, since the differences in level in the display region and the peripheral region occur at the same pitch as that of the array of pixels or at an integral multiple thereof, display unevenness due to the differences in level are believed to be relatively not conspicuous. Therefore, the recesses 12 may be formed only in the terminal region without providing the recesses 12 in the display region and the peripheral circuit region.

After all, when rubbing treatment is performed in the same direction as the extending direction of the data line 114 as shown in FIG. 14, the region in which the tips of fibers implanted in the buffing cloth for rubbing the display region 100a become disordered regardless of the pitch of the array of pixels is limited to the overlapping region between the region in which the connection terminals 107 and the wiring 171 are formed and the region 190a in which the buffing cloth for covering the display region 100a scans, i.e., the region B shown in FIG. 2. Therefore, for the purpose of only suppressing relatively easily visible display unevenness occurring independently of the pitch of the array of pixels, the recesses 12 may be formed only in the region B.

Additionally, when rubbing treatment is performed in the direction shown in FIG. 14, with respect to the region 192a, even if the buffing cloth becomes disordered, since the tips of fibers implanted in the buffing cloth are not applied to the display region 100a, the recesses 12 may not be formed in the region 192a (for example, in the scanning line drive circuit 130).

Figure 16:
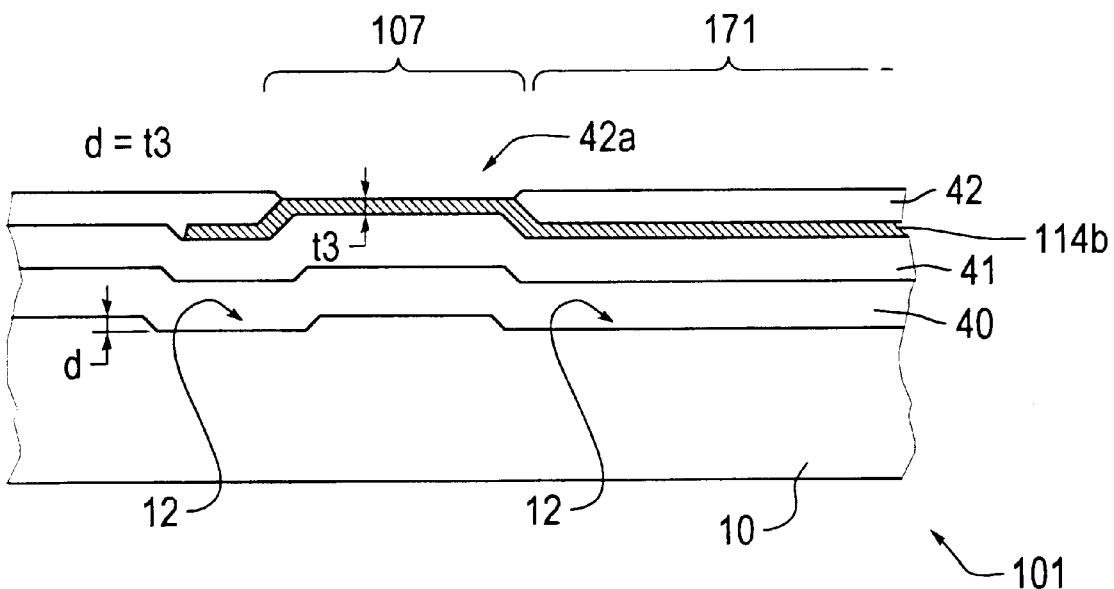
FIG. 16 is a sectional view showing a connection terminal and wiring leading to the connection terminal in an application of the present invention.

When the recesses 12 are formed only in the terminal region, it is not necessary to take the thickness of the conductive film 22b composed of the same film as that of the light-shielding layer 22 and the conductive film 112b composed of the same film as that of the scanning line 112 into consideration. Therefore, as shown in FIG. 16, the depth d of the recess 12 may be set to be substantially equal to the thickness $t_3$ of the conductive film 114b without providing a conductive film under the conductive film 114b.

(Others)

Additionally, in the embodiment described above, six data lines 114 constitute one block, and the image signals VID1 to VID6 converted into six systems are simultaneously sampled and supplied to the six data lines 114 belonging to the one block. However, the number of conversion and the number of data lines to be simultaneously supplied (i.e., the number of data lines constituting one block) are not limited to "6". For example, if the response speed of sampling switches 151 in a sampling circuit 150 is sufficiently high, image signals may be serially transmitted to one image signal line without parallel-converting the image signals, so that sampling is performed in dot sequence for each data line 114. The number of conversion and the number of data lines to be simultaneously supplied may be set to be "3", "12", "24", etc., so that image signals converted into 3 systems, 12 systems, 24 systems, etc., are simultaneously supplied to 3 data lines, 12 data lines, 24 data lines, etc. Additionally, with respect to the number of conversion and the number of data lines simultaneously applied, multiples of three are preferred in view of simplifying the control, the circuit, etc., because color image signals comprise signals relating to three primary colors. However, in the case of a projector used for only modulating light, which will be described below, it is not necessary to set the numbers to be multiples of three. Moreover, instead of simultaneously controlling sampling switches, the sampling switches 151 may be controlled in sequence by shifting and supplying parallel converted image signals VID1 to VID6 in sequence.

In the embodiment described above, the scanning lines 112 are scanned from the top to the bottom and the blocks are selected from left to right. However, the selection may be in an opposite direction to the above, and a configuration may be employed in which either direction can be selected depending on the applications.

In the embodiment described above, although planar TFTs 116, etc., are formed on the device substrate 101, the present invention is not limited to this. For example, the TFTs 116 may be of a bottom gate type. Alternatively, the device substrate 101 may be composed of a semiconductor substrate on which complementary transistors may be formed instead of TFTs 116. Moreover, by using the SOI (Silicon On Insulator) technique, a silicon single crystal film may be formed on an insulating substrate composed of sapphire, quartz, glass, or the like, and various elements are provided thereon to form a device substrate 101. However, when the device substrate 101 is not transparent, the liquid crystal device 100 must be used as a reflective display device by forming pixel electrodes 118 using aluminum or by forming a reflective layer separately.

(Projector)

Electronic apparatuses using the electro-optical device will be described. The electro-optical devices in the embodiments of the present invention may be used for various electronic apparatuses, such as personal computers, liquid crystal television, viewfinder type or monitor-direct-view type video tape recorders, car navigation apparatuses, pagers, electronic pocket diaries, electronic calculators, word processors, workstations, television telephones, POS terminals, digital still cameras, mobile phones, and apparatuses provided with touch panels.

The display unevenness which is overcome by the present invention, i.e., striped display unevenness in the rubbing direction, is relatively negligible in a direct-view type apparatus. However, in a projector in which a display image is projected, the display unevenness is expanded to such an extent that cannot be ignored.

Figure 17:
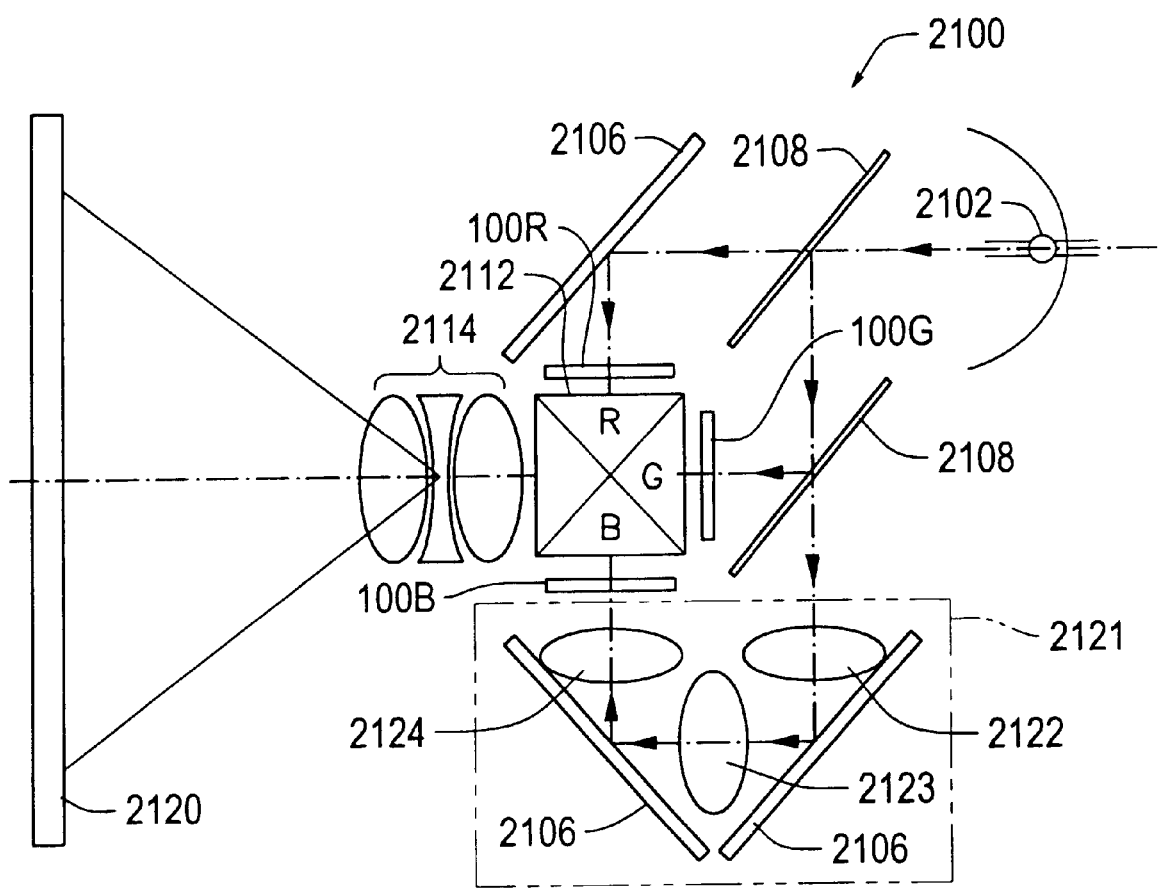
FIG. 17 is a plan view which shows the structure of a projector as an example of an electronic apparatus using an electro-optical device in an exemplary embodiment of the present invention.

As an example of the electronic apparatus, a projector will be described. The projector uses the liquid crystal device 100 described above as a light valve. FIG. 17 is a plan view showing the structure thereof. As shown in the drawing, a lamp unit 2102 comprising a white light source, such as a halogen lamp, is provided in a projector 2100. Projection light emitted from the lamp unit 2102 is separated by three mirrors 2106 and two dichroic mirrors 2108 into three primary color lights R, G, and B, which are guided to light valves 100R, 100G, and 100B corresponding to the individual primary colors, respectively. The light valves 100R, 100G, and 100B have the same structure as that of the liquid crystal device 100 in the embodiment described above, and are driven by signals of primary colors R, G, and B supplied from a processing circuit (not shown in the drawing) to which image signals are inputted. Since light of color B has a longer optical path in comparison with color R or color G, in order to avoid loss thereof, the light of color B is guided through a relay lens system 2121 comprising an incident side lens 2122, a relay lens 2123, and an emitting side lens 2124.

The color lights modulated by the light valves 100R, 100G, and 100B enter a dichroic prism 2112 from three directions. In the dichroic prism 2112, lights of color R and color B are refracted by 90 degrees, and light of color G travels straight. Therefore, after images of the individual colors are combined, a color image is projected to a screen 2120 by a projection lens 2114.

Additionally, since lights corresponding to the individual primary colors R, G, and B are introduced to the light valves 100R, 100G, and 100B by the dichroic mirrors 2108, it is not necessary to provide color filters. Since images passing through the light valves 100R and 100B are projected after being reflected by the dichroic prism 2112 and an image passing through the light valve 100G are projected as it is, the display images by the light valves 100R and 100B are reversed laterally relative to the display image by the light valve 100G.

The present invention is not limited to the embodiments described above. It is to be understood that the invention described herein is intended to embrace all such alternatives, modification, and variations as may fall within the spirit and scope of the appended claims.

What is claimed is:

1. A method for fabricating an electro-optical device for displaying a predetermined image in response to signals inputted through connection terminals provided on a substrate comprising a plurality of layers, the method comprising the steps of:

forming a recess in at least one of the layers constituting the substrate at a section for forming wiring extending to each connection terminal;

forming the wiring in a region corresponding to the recess; and depositing an insulating film on the wiring.

2. The method for fabricating an electro-optical device according to claim 1, the connection terminals being formed simultaneously with the step of forming the wiring, and the method further comprising the step of exposing the connection terminals covered by the insulating film subsequent to the step of depositing the insulating film.

3. The method for fabricating an electro-optical device according to claim 2, the step of exposing the connection terminals being a step of polishing the insulating film.

4. The method for fabricating an electro-optical device according to claim 1, wherein the step of forming the recess includes forming a recess in a peripheral circuit region at the same time.

5. The method for fabricating an electro-optical device according to claim 1, wherein the step of forming the recess includes forming a recess in a pixel transistor region at the same time.

6. The method for fabricating an electro-optical device according to claim 1, further comprising forming shading film over the recess of the peripheral circuit region.

7. The method for fabricating an electro-optical device according to claim 1, further comprising forming shading film over the recess of the pixel transistor region.

8. The method for fabricating an electro-optical device according to claim 1, wherein the wiring is same film as a gate electrode of the peripheral circuit.

9. The method for fabricating an electro-optical device according to claim 1, wherein the wiring is same film as a gate electrode of the pixel transistor.

* * * * *